US012762294B2

(12) United States Patent
Wang et al.

(10) Patent No.: US 12,762,294 B2
(45) Date of Patent: Oct. 13, 2026

(54) DETERMINING METHOD, SYSTEM, REFLECTOR, VERTICAL TANK EXTERNAL MEASUREMENT LIQUID LEVEL METER AND MOUNTING METHOD THEREOF

(71) Applicant: XI'AN DINGHUA ELECTRONICS CO., LTD., Xi'an (CN)

(72) Inventors: Dinghua Wang, Xi'an (CN); Rui Wang, Xi'an (CN); Pu Wang, Xi'an (CN)

(73) Assignee: XI'AN DINGHUA ELECTRONICS CO., LTD., Xi'an (CN)

( * ) Notice: Subject to any disclaimer, the term of this patent is extended or adjusted under 35 U.S.C. 154(b) by 315 days.

(21) Appl. No.: 18/292,796

(22) PCT Filed: Jul. 29, 2022

(86) PCT No.: PCT/CN2022/108766
§ 371 (c)(1),
(2) Date: Jan. 26, 2024

(87) PCT Pub. No.: WO2023/197479
PCT Pub. Date: Oct. 19, 2023

(65) Prior Publication Data
US 2024/0338494 A1 Oct. 10, 2024

(30) Foreign Application Priority Data
Apr. 14, 2022 (CN) ......................... 202210413543.0

(51) Int. Cl.
*G01F 23/296* (2022.01)
*G06F 30/10* (2020.01)

(52) U.S. Cl.
CPC ............ *G06F 30/10* (2020.01); *G01F 23/296* (2013.01)

(58) Field of Classification Search
CPC ............................... G06F 30/10; G01F 23/296
See application file for complete search history.

(56) References Cited

U.S. PATENT DOCUMENTS

2007/0261487 A1 11/2007 Sintes
2016/0041024 A1* 2/2016 Reimer ............... G01F 23/2962 73/290 V (Continued)

FOREIGN PATENT DOCUMENTS

CN 109883514 A 6/2019
CN 112729470 A 4/2021

(Continued)

OTHER PUBLICATIONS

International Search Report, with English translation, for International Patent Application No. PCT/CN2022/108766, mailed Jan. 18, 2023 (6 pages).

*Primary Examiner* — Abdallah Abulaban
(74) *Attorney, Agent, or Firm* — Nixon Peabody LLP

(57) ABSTRACT

The present disclosure discloses a determining method, a system, a reflector, a vertical tank external measurement liquid level meter and a mounting method thereof. An ultrasonic transmitting probe thereof is mounted on an outer wall of the measured vertical tank, and an ultrasonic signal emitted by the ultrasonic transmitting probe penetrates through a side wall of the vertical tank and generates an ultrasonic emission source at an inner wall of the vertical tank; an ultrasonic signal emitted by the ultrasonic emission source is emitted to the reflector, is returned to the position of the ultrasonic emission source according to the original path after passing through the liquid level of the measured vertical tank, penetrates through the side wall of the vertical tank and is received by a measuring head of the vertical tank (Continued)

external measurement liquid level meter mounted outside the side wall of the vertical tank.

16 Claims, 12 Drawing Sheets

(56) References Cited

U.S. PATENT DOCUMENTS

| | | | |
|---|---|---|---|
| 2018/0087949 | A1 | 3/2018 | Schutzbach |
| 2023/0392970 | A1 | 12/2023 | Wang |

FOREIGN PATENT DOCUMENTS

| | | | |
|---|---|---|---|
| JP | H11218436 | A | 8/1999 |
| JP | 2002365023 | A | 12/2002 |
| WO | WO 2013/013395 | A1 | 1/2013 |

* cited by examiner

DETERMINING METHOD, SYSTEM, REFLECTOR, VERTICAL TANK EXTERNAL MEASUREMENT LIQUID LEVEL METER AND MOUNTING METHOD THEREOF

CROSS REFERENCE TO RELATED APPLICATION

This patent application is a national stage application of International Patent Application No. PCT/CN2022/108766, filed on Jul. 29, 2022, which claims the benefit of and priority to Chinese Patent Application No. 202210413543.0, filed in the Chinese Patent Office on Apr. 14, 2022, each of which is hereby incorporated by reference herein in its.

TECHNICAL FIELD

The present disclosure relates to the technical field of liquid level measurement, in particular to a method for determining a reflector, a system for determining a reflector, a reflector, a vertical tank external measuring liquid level meter and a mounting method thereof.

BACKGROUND

The design process of the reflecting surface in the existing external measurement liquid level meter is as follows: each level of the N-level reflecting surface is designed by using a geometric construction calculation method, the positions of the boundary points of the reflecting surfaces at all levels are calculated step by step, and then the reflecting surfaces are designed according to the positions of the boundary points of the N-level reflecting surfaces. The reflecting surface can reflect the ray emitted by the ultrasonic measuring head in any direction to any specified direction, and has a wide range of applications. However, in the design process of the reflecting surface, there is no specific calculation formula, and the work is complicated and heavy.

SUMMARY

The present disclosure aims to provide a determining method, a system, a reflector, a vertical tank external measurement liquid level meter and a mounting method thereof, and the reflector is designed on the basis that the positions of boundary points of reflecting surfaces at all levels do not need to be calculated step by step, so as to reduce the calculation workload and improve the working efficiency.

In order to achieve the above purpose, the present disclosure provides the following scheme.

In a first aspect, the present disclosure provides a determining method for determining a reflector for reflecting an ultrasonic signal emitted by an ultrasonic emission source, wherein the determining method includes:

- determining a reference line segment; wherein an end point of the reference line segment is a position point T, a length of the reference line segment is equal to a focal length P of the reflector; and the position point T is the position of the ultrasonic emission source;
- based on the focal length P and the position point T, constructing a first right-handed three-dimensional rectangular coordinate system $O_1X_1Y_1Z_1$, a second right-handed three-dimensional rectangular coordinate system $TX_PY_PZ_P$ and a third right-handed three-dimensional rectangular coordinate system OXYZ; wherein the position point T is at a positive value of an $O_1Y_1$ coordinate axis of the first right-handed three-dimensional rectangular coordinate system $O_1X_1Y_1Z_1$, and a length of a line segment $O_1T$ is equal to half of the focal length P; the position point T is a coordinate origin of the second right-handed three-dimensional rectangular coordinate system $TX_PY_PZ_P$, the second right-handed three-dimensional rectangular coordinate system $TX_PY_PZ_P$ is obtained by translating the length of the line segment $O_1T$ in a direction of the positive value of the $O_1Y_1$ coordinate axis of the first right-handed three-dimensional rectangular coordinate system $O_1X_1Y_1Z_1$; a coordinate origin O of the third right-handed three-dimensional rectangular coordinate system OXYZ is at a positive value of the coordinate axis $TX_p$ of the second right-handed three-dimensional rectangular coordinate system $TX_PY_PZ_P$, and the coordinate origin O of the third right-handed three-dimensional rectangular coordinate system OXYZ is the other end point of the reference line segment; the length of the line segment TO is equal to the focal length P, the third right-handed three-dimensional rectangular coordinate system OXYZ is obtained by translating the length of the line segment TO in the direction of the positive value of the coordinate axis $TX_p$ of the second right-handed three-dimensional rectangular coordinate system $TX_PY_PZ_P$; and the position point T is located at a negative value of the OX axis of the third right-handed three-dimensional rectangular coordinate system OXYZ;
- according to the position point T and the focal length P, determining a basic cross section of the reflector on a $O_1X_1Y_1$ coordinate plane of the first right-handed three-dimensional rectangular coordinate system $O_1X_1Y_1Z_1$; wherein the basic cross section is a basic parabola, the focal length of the basic parabola is the focal length P; the focus of the basic parabola is the position point T; and the basic parabola rotates with the $O_1Y_1$ coordinate axis as the rotation axis to form a paraboloid;
- determining a first cross section of the reflector on the $TX_pY_p$ coordinate plane of the second right-handed three-dimensional rectangular coordinate system $TX_PY_PZ_P$ according to the form of the parabolic equation in the second right-handed three-dimensional rectangular coordinate system $TX_PY_PZ_P$; wherein the first cross section is a first parabola, the focal length of the first parabola is the focal length P; and the focus of the first parabola is the position point T;
- determining a second cross section of the reflector on the $TX_pZ_p$ coordinate plane of the second right-handed three-dimensional rectangular coordinate system $TX_PY_PZ_P$ according to the form of the parabolic equation in the second right-handed three-dimensional rectangular coordinate system $TX_PY_PZ_P$; wherein the second cross section is an arc; a radius of the arc is the focal length P; and a center of the arc is the position point T;
- determining a third cross section of the reflector on the OYZ coordinate plane of the third right-handed three-dimensional rectangular coordinate system OXYZ according to the form of the parabolic equation in the third right-handed three-dimensional rectangular coordinate system OXYZ; wherein the third cross section is a second parabola; the focal length of the second parabola is the focal length P; and the focus of the second parabola is the position point T;
- determining a parabolic reflector according to the basic cross section, the first cross section, the second cross section and the third cross section; wherein the center point of the parabolic reflector is the coordinate origin O, the focus of the parabolic reflector is the position point T, and the focal length of the parabolic reflector is the focal length P.

In a second aspect, the present disclosure provides a determining system for determining a reflector for reflecting an ultrasonic signal emitted by an ultrasonic emission source, wherein the determining system includes:

a reference line segment determining module, which is configured to determine a reference line segment; wherein an end point of the reference line segment is a position point T, a length of the reference line segment is equal to a focal length P of the reflector; and the position point T is the position of the ultrasonic emission source;

a coordinate system constructing module, which is configured to, based on the focal length P and the position point T, construct a first right-handed three-dimensional rectangular coordinate system $O_1X_1Y_1Z_1$, a second right-handed three-dimensional rectangular coordinate system $TX_PY_PZ_P$ and a third right-handed three-dimensional rectangular coordinate system OXYZ; wherein the position point T is at a positive value of an $O_1Y_1$ coordinate axis of the first right-handed three-dimensional rectangular coordinate system $O_1X_1Y_1Z_1$, and a length of a line segment $O_1T$ is equal to half of the focal length P; the position point T is a coordinate origin of the second right-handed three-dimensional rectangular coordinate system $TX_PY_PZ_P$, the second right-handed three-dimensional rectangular coordinate system $TX_PY_PZ_P$ is obtained by translating the length of the line segment $O_1T$ in a direction of the positive value of the $O_1Y_1$ coordinate axis of the first right-handed three-dimensional rectangular coordinate system $O_1X_1Y_1Z_1$; a coordinate origin O of the third right-handed three-dimensional rectangular coordinate system OXYZ is at a positive value of the coordinate axis $TX_p$ of the second right-handed three-dimensional rectangular coordinate system $TX_PY_PZ_P$, and the coordinate origin O of the third right-handed three-dimensional rectangular coordinate system OXYZ is the other end point of the reference line segment; the length of the line segment TO is equal to the focal length P, the third right-handed three-dimensional rectangular coordinate system OXYZ is obtained by translating the length of the line segment TO in the direction of the positive value of the coordinate axis $TX_p$ of the second right-handed three-dimensional rectangular coordinate system $TX_PY_PZ_P$; and the position point T is located at a negative value of the OX axis of the third right-handed three-dimensional rectangular coordinate system OXYZ;

a basic cross section determining module, which is configured to, according to the position point T and the focal length P, determine a basic cross section of the reflector on a $O_1X_1Y_1$ coordinate plane of the first right-handed three-dimensional rectangular coordinate system $O_1X_1Y_1Z_1$; wherein the basic cross section is a basic parabola, the focal length of the basic parabola is the focal length P; the focus of the basic parabola is the position point T; and the basic parabola rotates with the $O_1Y_1$ coordinate axis as the rotation axis to form a paraboloid;

a first cross section determining module, which is configured to determine a first cross section of the reflector on the $TX_pY_p$ coordinate plane of the second right-handed three-dimensional rectangular coordinate system $TX_PY_PZ_P$ according to the form of the parabolic equation in the second right-handed three-dimensional rectangular coordinate system $TX_PY_PZ_P$; wherein the first cross section is a first parabola; the focal length of the first parabola is the focal length P; and the focus of the first parabola is the position point T;

a second cross section determining module, which is configured to determine a second cross section of the reflector on the $TX_pZ_p$ coordinate plane of the second right-handed three-dimensional rectangular coordinate system $TX_PY_PZ_P$ according to the form of the parabolic equation in the second right-handed three-dimensional rectangular coordinate system $TX_PY_PZ_P$; wherein the second cross section is an arc; a radius of the arc is the focal length P; and a center of the arc is the position point T;

a third cross section determining module, which is configured to determine a third cross section of the reflector on the OYZ coordinate plane of the third right-handed three-dimensional rectangular coordinate system OXYZ according to the form of the parabolic equation in the third right-handed three-dimensional rectangular coordinate system OXYZ; wherein the third cross section is a second parabola; the focal length of the second parabola is the focal length P; and the focus of the second parabola is the position point T;

a reflector determining module, which is configured to determine a parabolic reflector according to the basic cross section, the first cross section, the second cross section and the third cross section; wherein the center point of the parabolic reflector is the coordinate origin O, the focus of the parabolic reflector is the position point T, and the focal length of the parabolic reflector is the focal length P.

In a third aspect, the present disclosure provides a reflector determined by the reflector determining method as described in the first aspect, wherein the reflector is used for reflecting an ultrasonic signal emitted by an ultrasonic emission source;

the reflector is a parabolic reflector; a center point of the parabolic reflector is the coordinate origin O, a focus of the parabolic reflector is the position point T, and the focal length of the parabolic reflector is the focal length P;

the coordinate of the center point of the reflector on the third right-handed rectangular coordinate system OXYZ is the coordinate origin O (0, 0, 0); the coordinate of the center point of the reflector on the second right-handed rectangular coordinate system $TX_PY_PZ_P$ is (P,0,0), and the coordinate of the center point of the reflector on the first right-handed rectangular coordinate system $O_1X_1Y_1Z_1$ is (P,P/2,0);

wherein the equations of paraboloids in the first right-handed three-dimensional rectangular coordinate system $O_1X_1Y_1Z_1$, the second right-handed three-dimensional rectangular coordinate system $TX_PY_PZ_P$ and the third right-handed three-dimensional rectangular coordinate system OXYZ are used to form a data table (x,y,z) of paraboloids, and a parabolic reflector is manufactured according to the data table (x,y,z) of paraboloids.

In a fourth aspect, the present disclosure provides a vertical tank external measurement liquid level meter, including a liquid level determining module, an ultrasonic signal source locator, and the reflector as described in the third aspect;

wherein the ultrasonic signal source locator includes an ultrasonic transmitting probe, an ultrasonic transmitting circuit connected with the ultrasonic transmitting probe, an ultrasonic receiving probe, an ultrasonic receiving circuit connected with the ultrasonic receiving probe and an ultrasonic intensity indicator; wherein the ultrasonic transmitting probe emits ultrasonic waves to a vertical tank wall from the outside of the vertical tank, and the ultrasonic receiving probe receives ultrasonic signals from the inside of the vertical tank wall, uses the intensity indication displayed by the ultrasonic intensity indicator to find the position of the received strongest ultrasonic signals, and determines a position point T of an ultrasonic transmitting source formed on the inside of the vertical tank wall after the ultrasonic waves emitted by the ultrasonic transmitting probe from the outside of the vertical tank wall pass through the vertical tank wall;

the liquid level determining module consists of an external measurement liquid level meter; and the external measurement liquid level meter is configured to measure a liquid level height in the vertical tank from the outside of the vertical tank.

In a fifth aspect, the present disclosure provides a mounting method, wherein the mounting method is used for mounting the vertical tank external measurement liquid level meter as described in the fourth aspect, including:

determining a selection area; wherein the selection area includes a space area between an ultrasonic signal source and the reflector and a space area between the reflector and a liquid level directly above the reflector, wherein a measured vertical tank has no structure for blocking the ultrasonic signal propagation in the selection area;

determining a position point of an ultrasonic emission source on an inner wall of the measured vertical tank by using an ultrasonic signal source locator in the selection area;

determining a placement point of a center point of the reflector according to the position point of the ultrasonic emission source and the focal length P;

mounting the reflector according to the placement point, so that the center point of the reflector coincides with the placement point, and the focus of the reflector is the position point of the ultrasonic emission source.

According to the specific embodiment provided by the present disclosure, the present disclosure discloses the following technical effects.

In the present disclosure, a parabolic function is used to design a reflector of a vertical tank external measurement liquid level meter. When the vertical tank external measurement liquid level meter works, an ultrasonic transmitting probe thereof is mounted on an outer wall of the measured vertical tank, and an ultrasonic signal emitted by the ultrasonic transmitting probe penetrates through a side wall of the vertical tank and generates an ultrasonic emission source at an inner wall of the vertical tank; a position point of the ultrasonic emission source is also a focus of the reflector; an ultrasonic signal emitted by the ultrasonic emission source is emitted to the reflector, is reflected by the reflector, is emitted in parallel to a preset direction, is returned to the position of the ultrasonic emission source according to the original path after passing through the liquid level of the measured vertical tank, penetrates through the side wall of the vertical tank and is received by a measuring head of the external measurement liquid level meter mounted outside the side wall of the vertical tank; the external measurement liquid level meter determines, according to the emitted ultrasonic signal and the received ultrasonic signal, the liquid level position of the measured vertical tank. Obviously, the reflector provided by the present disclosure can meet the requirement that the rays emitted from the focus to any direction in front are emitted parallel to the preset direction after being reflected by the reflector without calculating the positions of boundary points of reflecting surfaces at all levels step by step, thus achieving the purpose of reducing the calculation workload and improving the working efficiency.

BRIEF DESCRIPTION OF THE DRAWINGS

In order to explain the technical scheme of the embodiments of the present disclosure or the prior art more clearly, the drawings needed in the embodiments will be briefly introduced hereinafter. Obviously, the drawings in the following description are some embodiments of the present disclosure, and other drawings can be obtained according to these drawings without creative labor for those skilled in the art.

FIG. 3A is a schematic diagram of the whole structure; FIG. 3B is a front view; and FIG. 3C is a plan view.

DETAILED DESCRIPTION OF THE EMBODIMENTS

The technical schemes in the embodiments of the present disclosure will be clearly and completely described with reference to the drawings in the embodiments of the present disclosure hereinafter. Obviously, the described embodiments are only some embodiments of the present disclosure, rather than all of the embodiments. Based on the embodiment of the present disclosure, all other embodiments obtained by those skilled in the art without creative labor belong to the scope of protection of the present disclosure.

The present disclosure aims to provide a determining method, a system, a reflector, a vertical tank external measurement liquid level meter and a mounting method thereof, and the reflector is designed on the basis that the positions of boundary points of reflecting surfaces at all levels do not need to be calculated step by step, so as to reduce the calculation workload and improve the working efficiency.

In order to make the above objectives, features and advantages of the present disclosure more obvious and understandable, the present disclosure will be further described in detail hereinafter in conjunction with the attached drawings and specific embodiments.

Figure 1:
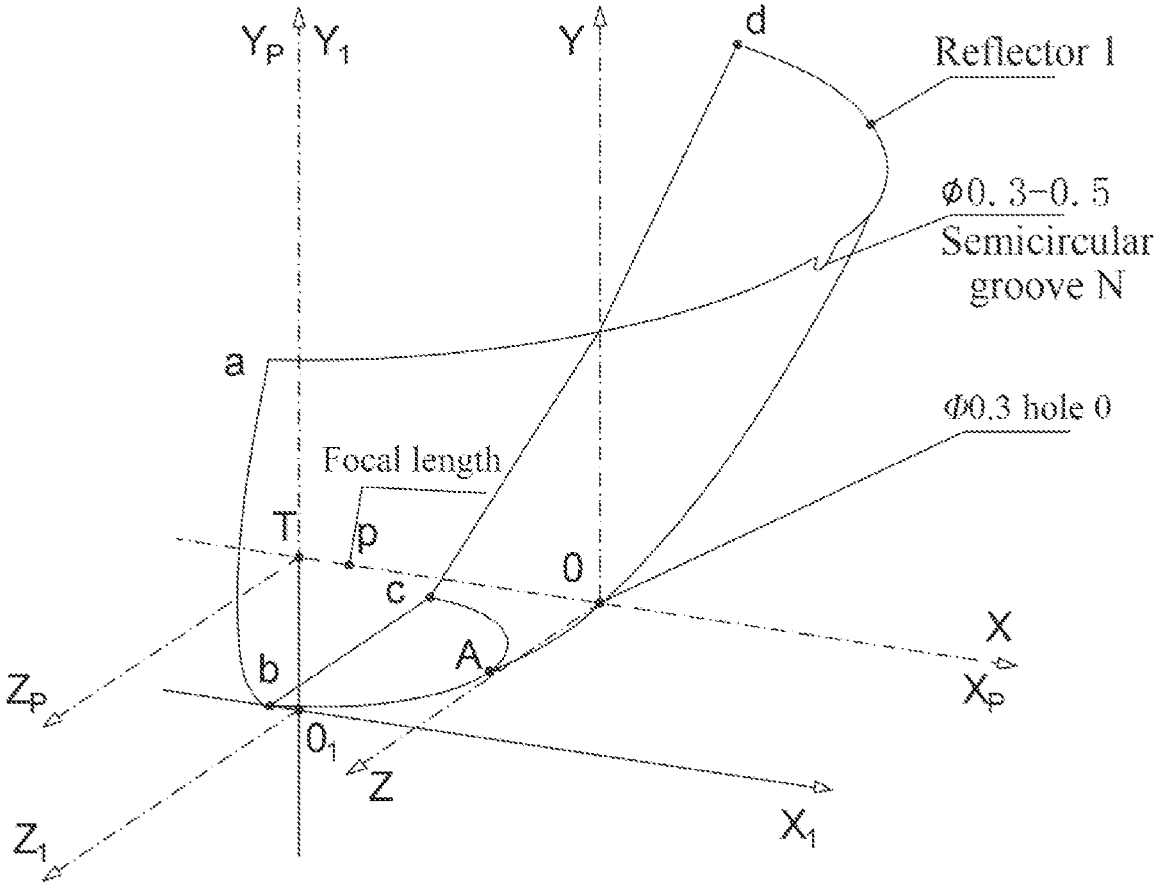
FIG. 1 is a schematic structural diagram of a reflector according to the present disclosure.

In order to make the vertical tank external measurement liquid level meter conveniently measure the liquid level of the vertical tank from the outside of the side wall of the vertical tank, the present disclosure provides a reflector as shown in FIG. 1, so that the ultrasonic signals scattered in all directions and emitted from the probe of the external measurement liquid level meter are vertically emitted to the liquid level of the vertical tank in parallel after being reflected by the reflector.

Embodiment 1

As shown in FIG. 1, this embodiment provides a reflector of a vertical tank external measurement liquid level meter designed by using a parabolic function, that is, a parabolic reflector is provided.

The reflector is a parabolic reflector; a center point of the parabolic reflector is the coordinate origin O, a focus of the parabolic reflector is the position point T, and the focal length of the parabolic reflector is the focal length P.

The coordinate of the center point of the reflector on the third right-handed rectangular coordinate system OXYZ is the coordinate origin O (0, 0, 0); the coordinate of the center point of the reflector on the second right-handed rectangular coordinate system $TX_PY_PZ_P$ is (P,0,0), and the coordinate of the center point of the reflector on the first right-handed rectangular coordinate system $O_1X_1Y_1Z_1$ is (P,P/2,0).

The equations of paraboloids in the first right-handed three-dimensional rectangular coordinate system $O_1X_1Y_1Z_1$, the second right-handed three-dimensional rectangular coordinate system $TX_PY_PZ_P$ and the third right-handed three-dimensional rectangular coordinate system OXYZ are used to form a data table (x,y,z) of paraboloids, and a parabolic reflector is manufactured according to the data table (x,y,z) of paraboloids.

The position point T is at a positive value of an $O_1Y_1$ coordinate axis of the first right-handed three-dimensional rectangular coordinate system $O_1X_1Y_1Z_1$, and a length of a line segment $O_1T$ is equal to half of the focal length P; the position point T is a coordinate origin of the second right-handed three-dimensional rectangular coordinate system $TX_PY_PZ_P$, the second right-handed three-dimensional rectangular coordinate system $TX_PY_PZ_P$ is obtained by translating the length of the line segment $O_1T$ in a direction of the positive value of the $O_1Y_1$ coordinate axis of the first right-handed three-dimensional rectangular coordinate system $O_1X_1Y_1Z_1$; a coordinate origin O of the third right-handed three-dimensional rectangular coordinate system OXYZ is at a positive value of the coordinate axis $TX_p$ of the second right-handed three-dimensional rectangular coordinate system $TX_PY_PZ_P$, and the coordinate origin O of the third right-handed three-dimensional rectangular coordinate system OXYZ is the other end point of the reference line segment; the length of the line segment TO is equal to the focal length P, the third right-handed three-dimensional rectangular coordinate system OXYZ is obtained by translating the length of the line segment TO in the direction of the positive value of the coordinate axis $TX_p$ of the second right-handed three-dimensional rectangular coordinate system $TX_PY_PZ_P$; and the position point T is located at a negative value of the OX axis of the third right-handed three-dimensional rectangular coordinate system OXYZ.

According to the position point T and the focal length P, determining a basic cross section of the reflector on a $O_1X_1Y_1$ coordinate plane of the first right-handed three-dimensional rectangular coordinate system $O_1X_1Y_1Z_1$ is determined; wherein the basic cross section is a basic parabola, the focal length of the basic parabola is the focal length P; the focus of the basic parabola is the position point T; and the basic parabola rotates with the $O_1Y_1$ coordinate axis as the rotation axis to form a paraboloid.

The equation of the basic parabola on the $O_1X_1Y_1$ coordinate plane of the first right-handed three-dimensional rectangular coordinate system $O_1X_1Y_1Z_1$ is $x_1^2=2Py_1$; where $x_1$ is an $X_1$ coordinate of the $O_1X_1Y_1$ coordinate plane, and $y_1$ is the $Y_1$ coordinate of the $O_1X_1Y_1$ coordinate plane.

The parabolic equation is in the form of $x_1^2+z_1^2=2Py_1$ on the first right-handed three-dimensional rectangular coordinate system $O_1X_1Y_1Z_1$; wherein $x_1$ is the coordinate on the coordinate axis $O_1X_1$ of the first right-handed three-dimensional rectangular coordinate system $O_1X_1Y_1Z_1$, $y_1$ is the coordinate on the $O_1Y_1$ coordinate axis of the first right-handed three-dimensional rectangular coordinate system $O_1X_1Y_1Z_1$, and $z_1$ is the coordinate on the $O_1Z_1$ coordinate axis of the first right-handed three-dimensional rectangular coordinate system $O_1X_1Y_1Z_1$.

The parabolic equation is in the form of $x_p^2+z_p^2=2P(y_P+P/2)$ in the second right-handed three-dimensional rectangular coordinate system $TX_PY_PZ_P$; wherein $x_p$ is the coordinate on the coordinate axis $TX_p$ of the second right-handed three-dimensional rectangular coordinate system $TX_PY_PZ_P$, $y_p$ is the coordinate on the $TY_p$ coordinate axis of the second right-handed three-dimensional rectangular coordinate system $TX_PY_PZ_P$, and $z_p$ is the coordinate on the $TZ_p$ coordinate axis of the second right-handed three-dimensional rectangular coordinate system $TX_PY_PZ_P$.

The parabolic equation is in the form of $(x+P)^2+z^2=2Py+P^2$ in the third right-handed three-dimensional rectangular coordinate system OXYZ; wherein x is the coordinate on the OX coordinate axis of the third right-handed three-dimensional rectangular coordinate system OXYZ, y is the coordinate on the OY coordinate axis of the third right-handed three-dimensional rectangular coordinate system OXYZ, and z is the coordinate on the OZ coordinate axis of the third right-handed three-dimensional rectangular coordinate system OXYZ.

The equation of the first parabola is $x_p^2=2Py_p+P^2$; on the first cross section, a pitch angle of the ultrasonic emission source emitted from the coordinate origin T on the $TX_pY_p$ coordinate plane of the second right-handed three-dimensional rectangular coordinate system $TX_PY_PZ_P$ to any point $(x_p,y_p)$ on the first parabola of the reflecting surface of the parabolic reflector is $\theta$=art $(y_p/x_p)$; wherein $x_p$ is a $TX_p$ coordinate value of a projection point $(x_p,y_p)$ on the first parabola, $y_p$ is a $TY_p$ coordinate value of the projection point $(x_p,y_p)$ on the first parabola; the range of the pitch angle is the range of a radiation angle of the ultrasonic signal emitted by the ultrasonic emission source on the $TX_pY_p$ coordinate plane.

The equation of the arc is $x_p^2+z_p^2=P^2$; a horizontal angle of the ultrasonic emission source from the coordinate origin T of the second right-handed three-dimensional rectangular coordinate system $TX_PY_PZ_P$ to any point $(x_p,z_p)$ on the arc of the reflecting surface of the parabolic reflector is $\theta$=art $(z_p/x_p)$; wherein $x_p$ is a $TX_p$ coordinate value of the projection point $(x_p,z_p)$ that the ultrasonic signal emitted from the position point T emits on the arc of the $TX_pZ_p$ coordinate plane, $z_p$ is a $TZ_p$ coordinate value of the projection point ($x_p$,$z_p$) that the ultrasonic signal emitted from the position point T emits on the arc of the $TX_pZ_p$ coordinate plane; the range of the horizontal angle is the range of the radiation angle of the ultrasonic signal emitted by the ultrasonic emission source on the $TX_pZ_p$ coordinate plane; the equation of the second parabola is $z^2=2Py$, and the second parabola is on the OYZ coordinate plane of the third right-handed three-dimensional rectangular coordinate system OXYZ.

The reflector is made of materials such as steel and brass whose acoustic impedance is much greater than that of the measured liquid. For example, the acoustic impedance of liquid is 1, the acoustic impedance of steel is 45, and the acoustic reflectivity in liquid is 1−1/45=97.8%. In order to prevent the interference resulted from the reflected wave on the front of the reflector and the reflected wave on the back of the reflector, the reflector is made into a thin plate with a thickness of 0.5~1 mm, or a non-plate member whose back is not parallel to the front. For the convenience of subsequent mounting, a locating hole O with a diameter of Φ0.3~Φ0.5 is provided at the center of the reflector, that is, a center hole. A semicircular groove N with a diameter of Φ0.5~Φ2 is provided at the highest point of the reflector, that is, at the highest point ($X_N$,$Y_N$,0) of the cross section of the XOY coordinate plane of the third right-handed three-dimensional rectangular coordinate system OXYZ of the reflector.

The third right-handed three-dimensional rectangular coordinate system OXYZ is constructed based on the focal length P and the center point of the reflector, wherein the focus is located at the negative value of the OX axis of the third right-handed three-dimensional rectangular coordinate system OXYZ.

In this embodiment, the parabolic function is used to design the reflector without calculating the positions of boundary points of reflecting surfaces at all levels step by step, so as to reduce the calculation workload, improve the working efficiency, and popularize and apply the parabolic reflector easily.

Embodiment 2

Figure 2:
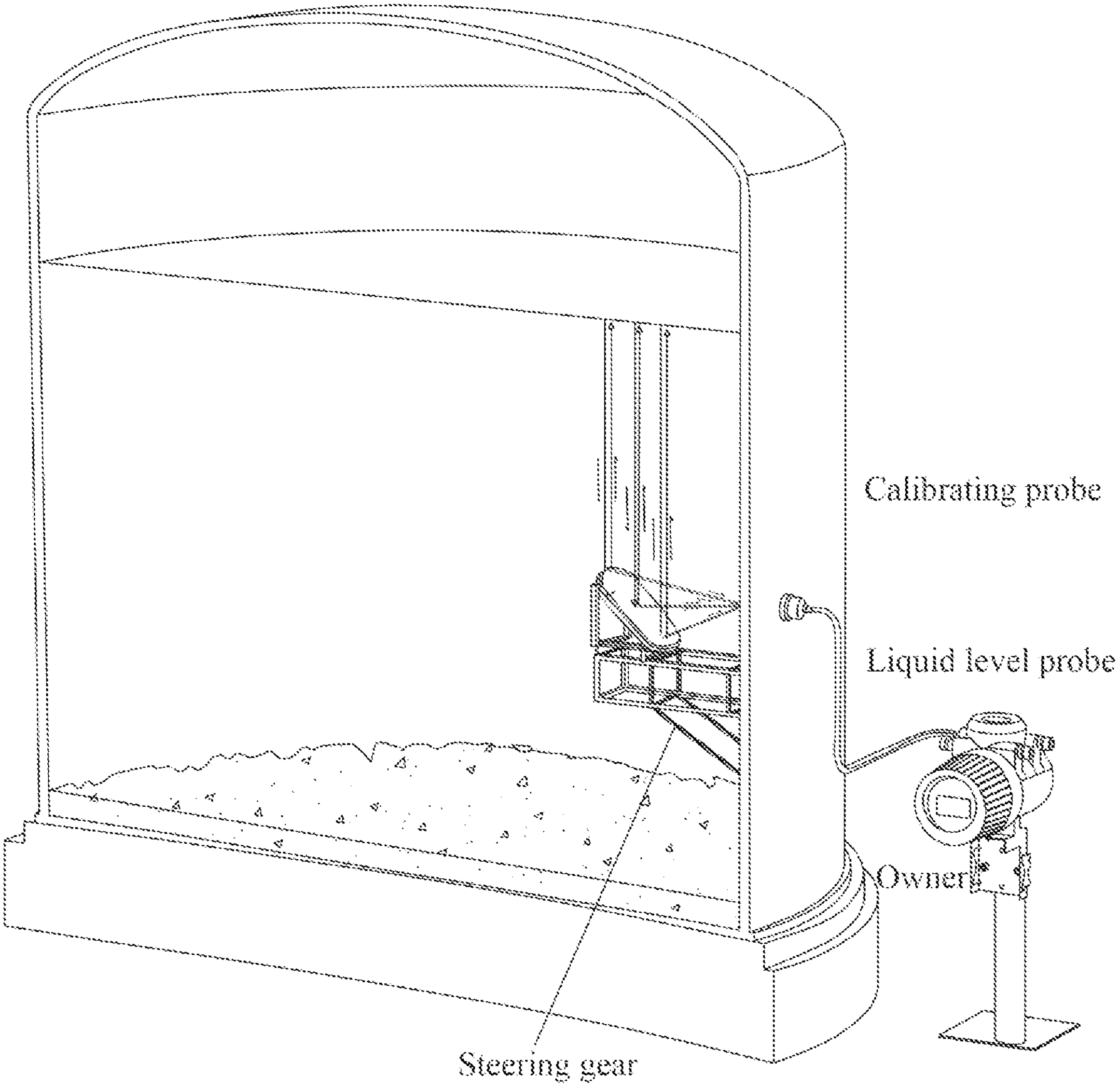
FIG. 2 is a physical diagram of a vertical tank external measurement liquid level meter according to the present disclosure.

Referring to FIG. 2, this embodiment provides a new vertical tank external measurement liquid level meter, including a liquid level determining module, an ultrasonic signal source locator, and the reflector as described in Embodiment 1.

The ultrasonic signal source locator includes an ultrasonic transmitting probe, an ultrasonic transmitting circuit connected with the ultrasonic transmitting probe, an ultrasonic receiving probe, an ultrasonic receiving circuit connected with the ultrasonic receiving probe and an ultrasonic intensity indicator; wherein the ultrasonic transmitting probe emits ultrasonic waves to a vertical tank wall from the outside of the vertical tank, and the ultrasonic receiving probe receives ultrasonic signals from the inside of the vertical tank wall, uses the intensity indication displayed by the ultrasonic intensity indicator to find the position of the received strongest ultrasonic signals, and determines a position point T of an ultrasonic transmitting source formed on the inside of the vertical tank wall after the ultrasonic waves emitted by the ultrasonic transmitting probe from the outside of the vertical tank wall pass through the vertical tank wall; the liquid level determining module consists of an external measurement liquid level meter; and the external measurement liquid level meter is configured to measure a liquid level height in the vertical tank from the outside of the vertical tank.

Embodiment 3

On the basis of Embodiment 2, the external measurement liquid level meter further includes a supporting part. The supporting part is used for mounting the reflector in the measured vertical tank.

The supporting part described in this embodiment can fix the reflector in any way, which can be said to be infinite. For example, the supporting part uses four supporting rods, and for example, the supporting part is fixed on the side wall of the vertical tank.

Figure 3A:
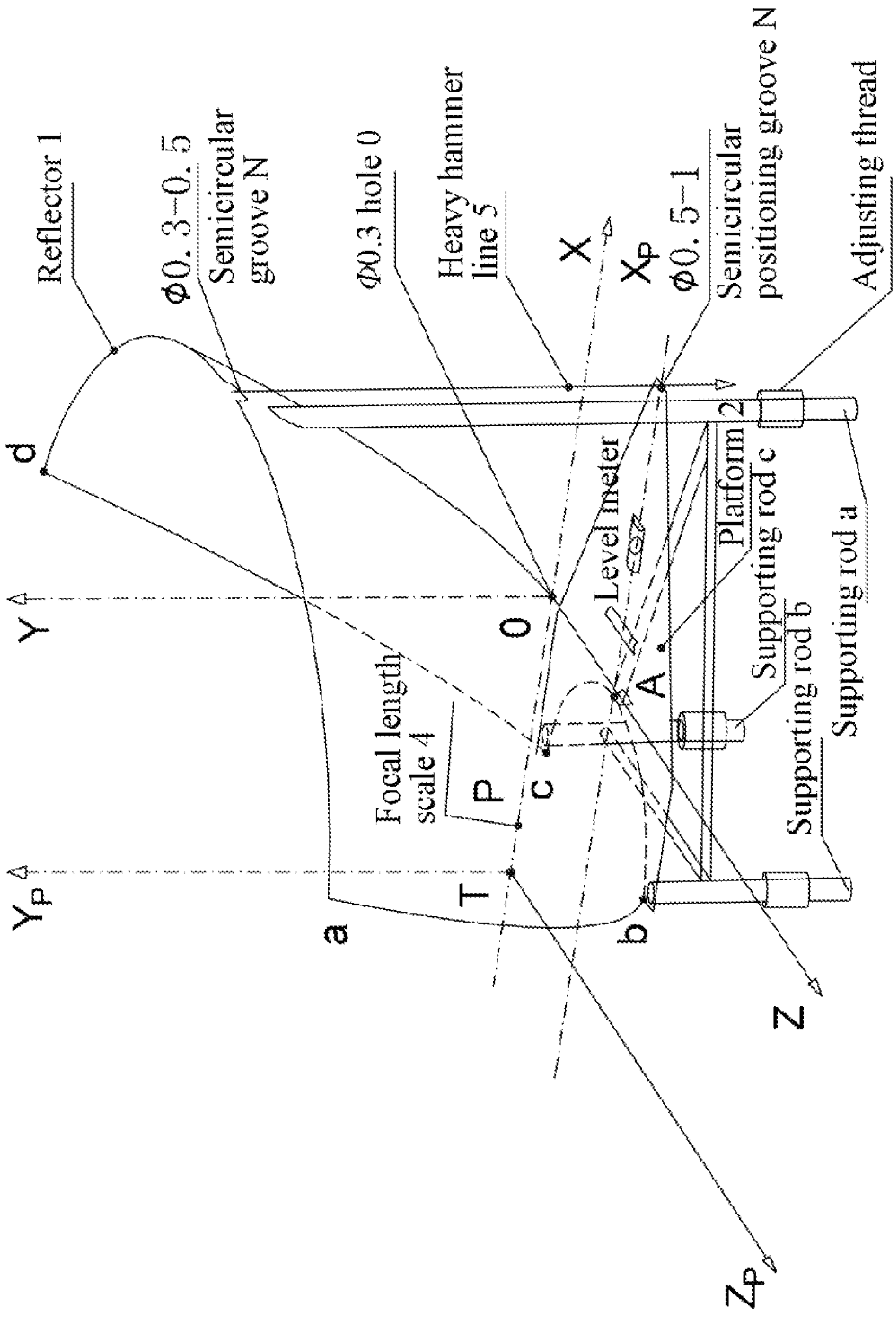
FIGS. 3A-C are schematic structural diagrams of a reflector according to the present disclosure when it is mounted on a platform.
Figure 3B:
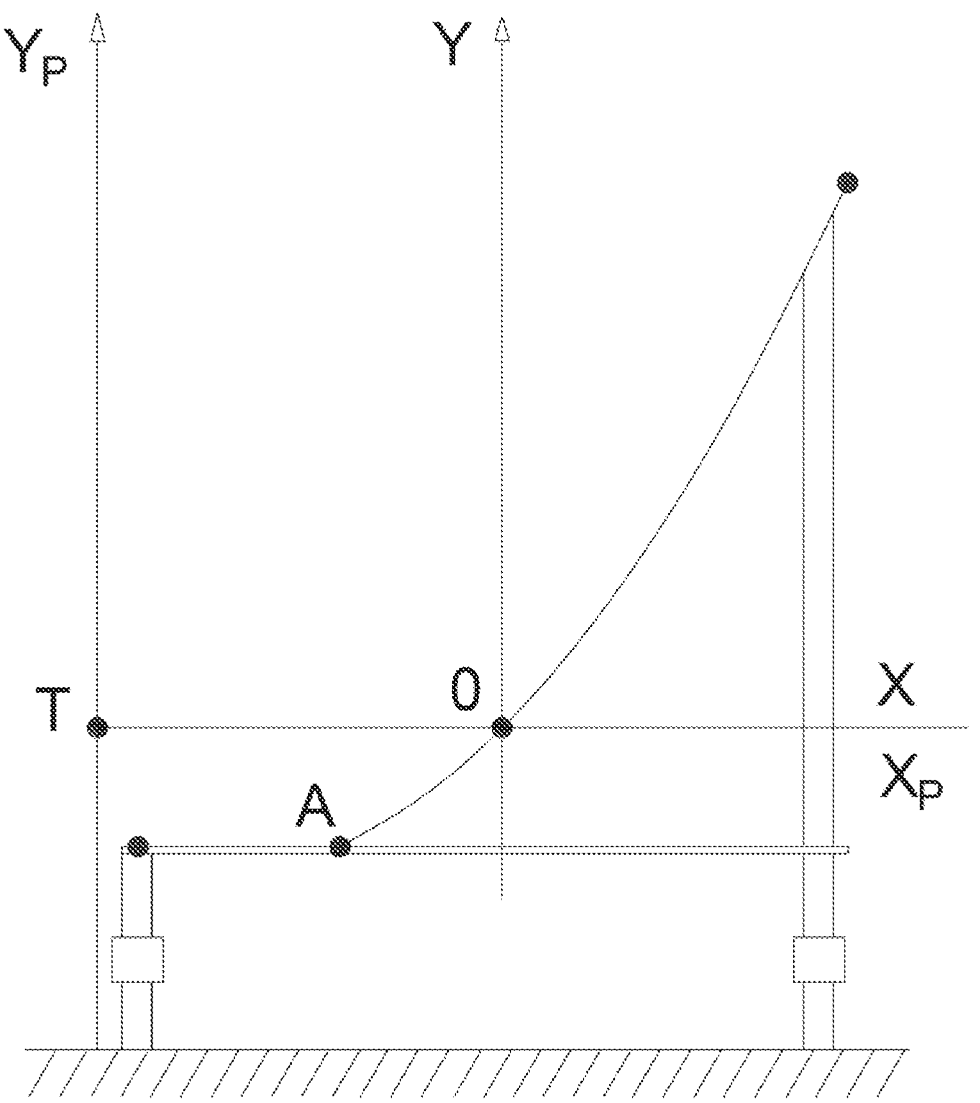
Figure 3C:
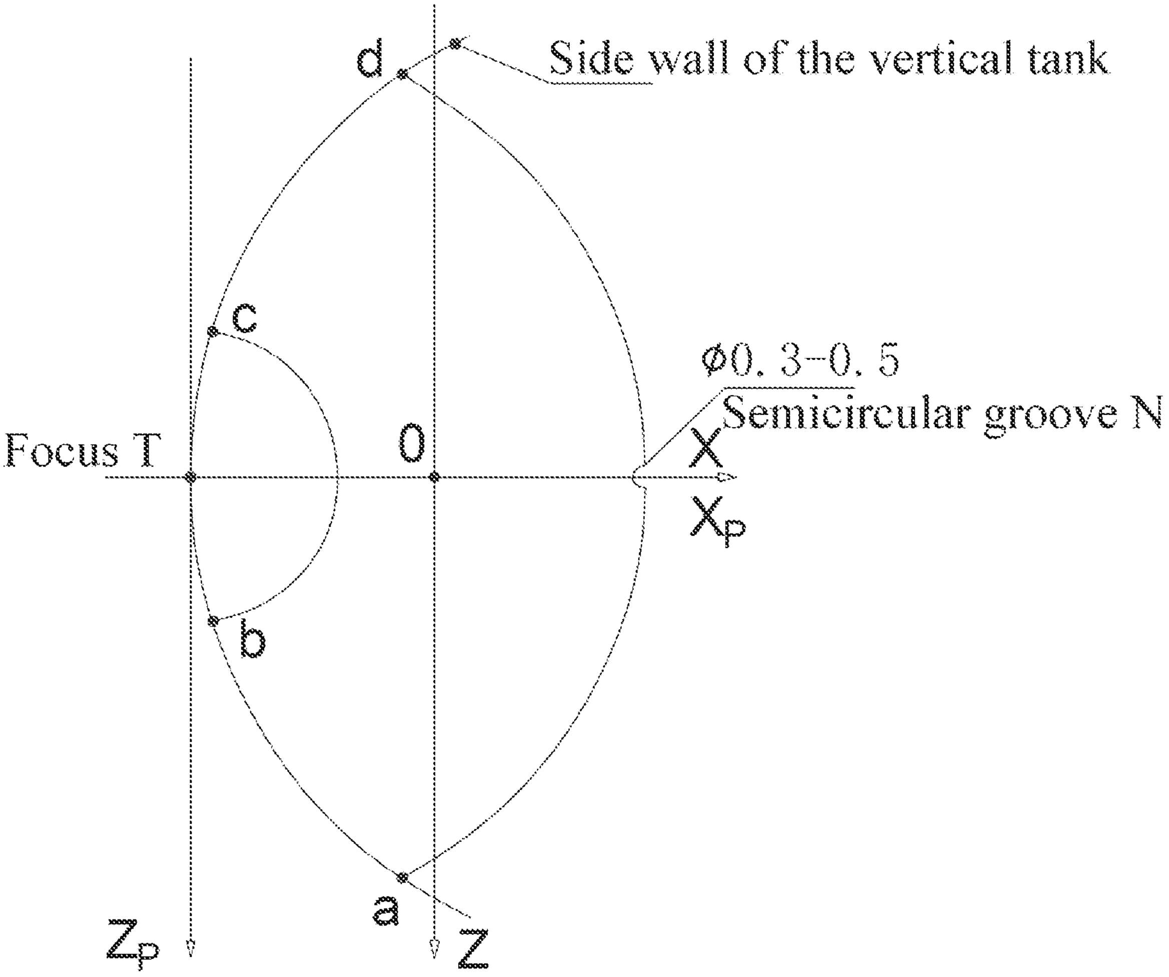

In one example, as shown in FIGS. 3A-C, the supporting part includes a platform 2; a symmetrical center line of the platform 2 is on the OXY coordinate plane in the third right-handed three-dimensional rectangular coordinate system OXYZ; wherein the third right-handed three-dimensional rectangular coordinate system OXYZ is constructed based on the focal length P and the center point of the reflector, and the center point of the reflector is at the coordinate origin O(0, 0, 0) of the third coordinate system OXYZ.

The focus is located at the negative value of the OX axis of the third right-handed three-dimensional rectangular coordinate system OXYZ. In addition, the third right-handed three-dimensional rectangular coordinate system OXYZ further includes an OY axis and an OZ axis.

The platform 2 is a platform made of a metal sheet, and the reflector 1 is fixed on the platform.

The bc arc edge of the platform 2 near the side wall of the vertical tank coincides with the lower end of the reflector 1, where point A($X_A$,$Y_A$,0) is the lower end point of the parabola of the cross section between the reflector and the OXY coordinate plane of the third right-handed three-dimensional rectangular coordinate system OXYZ. The end of the platform 2 far away from the side wall of the vertical tank is located at the point M($X_M$,0,0) on the third right-handed rectangular coordinate system OXYZ. A semicircular groove M with a diameter of Φ0.5~Φ1 is provided at the point M($X_M$,0,0) of the platform. The platform 2 is equipped with a level meter in the direction of the OX coordinate axis and a level meter in the direction of the OZ coordinate axis. The purpose of mounting these two level meters is to mount the platform 2 parallel to the OXZ coordinate plane.

Further, the supporting part further at least includes three tubular supporting rods 3 with adjustable lengths and fastened by screws, namely a first supporting rod a, a second supporting rod b and a third supporting rod c; the first supporting rod a, the second supporting rod b and the third supporting rod c are connected and fixed with each other through a transverse connecting rod.

An upper end of the first supporting rod passes through the vicinity of a semicircular groove M of the supporting part and the vicinity of a semicircular groove N of the reflector in sequence; the second supporting rod and the third supporting rod are located at both sides of the first supporting rod, respectively; an upper end of the second supporting rod and an upper end of the third supporting rod are both fixed on the supporting part (or points b and c of the platform 2 as shown in FIGS. 3A-C).

A highest point ($X_N$,$Y_N$,0) of the reflector 1 on the OXY coordinate plane of the third right-handed three-dimensional rectangular coordinate system OXYZ is the semicircular groove N; the semicircular groove M is on the symmetrical center line of the platform, and the coordinate of the semicircular groove M in the third right-handed three-dimensional rectangular coordinate system OXYZ is ($X_N$, 0,0).

A lower end of the first supporting rod a, a lower end of the second supporting rod b and a lower end of the third supporting rod c are all fixed at the bottom of the measured vertical tank during operation.

In another example: for the working condition that the reflector cannot be mounted at the bottom of the tank, for example, 1, when the reflector cannot be mounted at the bottom of the measured vertical tank; 2, when the vertical tank external measurement liquid level meter is used in a sausage-shaped tank, there are other devices in the tank for sheltering or the radian of the oval tank bottom is large, that is, the reflector cannot be mounted at the bottom of the vertical tank. At this time, the supporting rod of the steering gear should be fixed on the side wall of the vertical tank.

Figure 4:
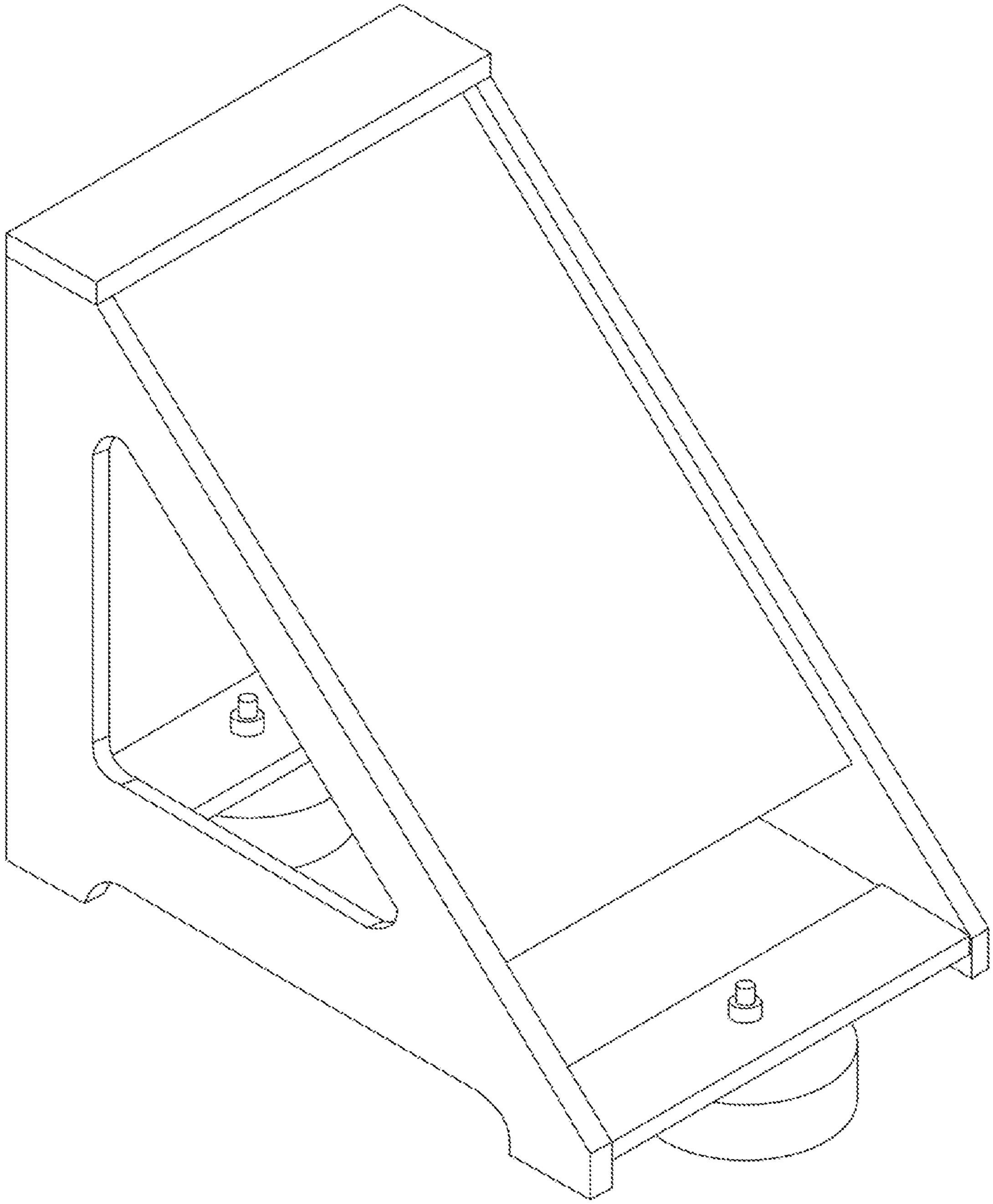
FIG. 4 is a schematic structural diagram of a steering gear according to the present disclosure.

As shown in FIG. 4, the steering gear in the external measurement liquid level meter refers to the combination of the reflector and the supporting part, that is, the reflector is fixed on the supporting part to form the steering gear; and the steering gear is mounted on the inner side wall of the measured vertical tank through the supporting rod.

Because the steering gear needs to be mounted on the inner side wall of the measured vertical tank by welding, the necessary condition for mounting the steering gear is that people can enter the tank and fire.

The mounting position of the steering gear is selected as follows: a low position in the tank for easy operation, but it is not allowed to enter the liquid residue sediment layer accumulated at the bottom of the tank to prevent the sediment from blocking the ultrasonic signal propagation, and avoid upper structural parts to prevent the transmission of ultrasonic waves between the steering gear and the liquid level from being obstructed.

In addition, the steering gear can be horizontally mounted on the inner side wall of the measured vertical tank, and its physical diagram is shown in FIG. 2.

Embodiment 4

On the basis of Embodiment 3, this embodiment provides a mounting method.

Figure 5:
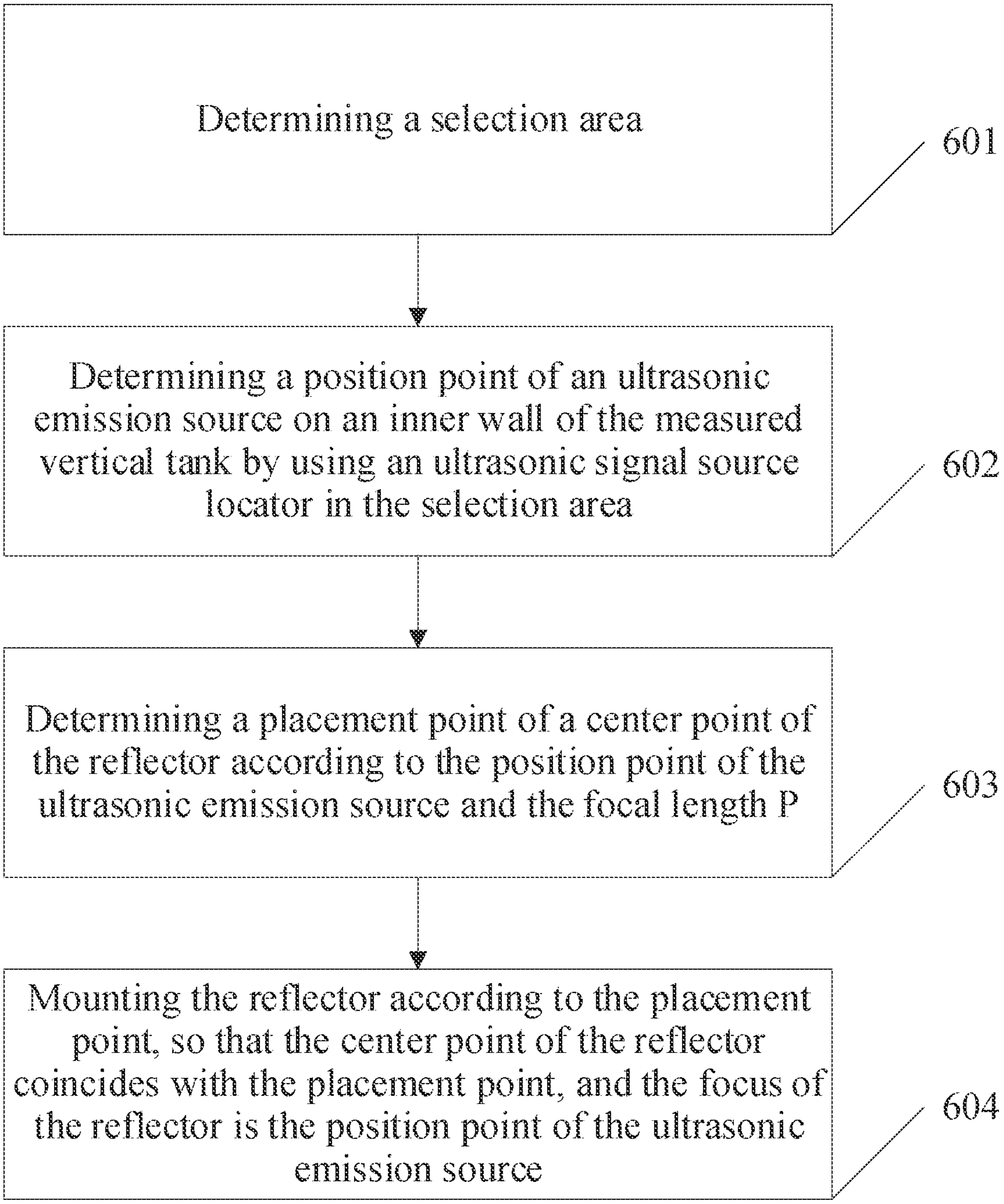
FIG. 5 is a schematic flow chart of a method of mounting an external measurement liquid level meter according to the present disclosure.

As shown in FIG. 5, the mounting method provided by this embodiment is used for mounting the external measurement liquid level meter, wherein the method includes:

- Step 601: determining a selection area; wherein the selection area includes a space area between an ultrasonic signal source and the reflector and a space area between the reflector and a liquid level directly above the reflector, wherein a measured vertical tank has no structure for blocking the ultrasonic signal propagation in the selection area;
- Step 602: determining a position point of an ultrasonic emission source on an inner wall of the measured vertical tank by using an ultrasonic signal source locator in the selection area;
- Step 603: determining a placement point of a center point of the reflector according to the position point of the ultrasonic emission source and the focal length P;
- Step 604: mounting the reflector according to the placement point, so that the center point of the reflector coincides with the placement point, and the focus of the reflector is the position point of the ultrasonic emission source.

In Step 602, the ultrasonic signal source locator includes an ultrasonic transmitting circuit, an ultrasonic transmitting probe, an ultrasonic receiving circuit, an ultrasonic receiving probe and an ultrasonic intensity indicator connected with the ultrasonic receiving probe.

Step 602 specifically includes:

- Step A: mounting the ultrasonic transmitting probe on a target area of an outer wall of the measured vertical tank, wherein the target area is opposite to the selection area;
- Step B: mounting the ultrasonic receiving probe on the inner wall corresponding to the ultrasonic transmitting probe;
- Step C: adjusting the positions of the ultrasonic transmitting probe and the ultrasonic receiving probe through the ultrasonic intensity indicator until the position with a strongest signal is determined; wherein the position with the strongest signal is located in the target area; and the position with the strong signal is the position point of the ultrasonic emission source;
- Step D: marking the position of the ultrasonic transmitting probe outside the selected side wall of the vertical tank and the position point of the ultrasonic emission source inside the side wall of the vertical tank, respectively, and then dismantling the ultrasonic signal source locator.

Referring to FIGS. 3A-C, Step 603 specifically includes: fixing the magnetic adsorption end of the focal length scale at the position point of the ultrasonic emission source by a magnetic force; the focal length scale is a straight rod with a length equal to the focal length P, one end of the focal length scale is tip-shaped, and the other end thereof is provided with a magnetic base, an end face of the magnetic base is perpendicular to an axial direction of the focal length scale; when in use, the end of the magnetic base of the focal length scale is adsorbed on the position of the ultrasonic emission source marked on the inner wall of the vertical tank. The position of the reflector is mounted and adjusted, so that the tip of the focal length scale is inserted into the small hole at the center point O of the reflector, and the center point of the reflector is positioned at the placement point. The step further includes:

- Step a: the absorption end of the focal length scale 4 is fixed at the position point of the ultrasonic emission source. The focal length scale 4 includes a magnetic base, an adsorption end, a tip end and a scale rod connecting the adsorption end and the tip end.

When implementing Step a, the adsorption end is fixed on the magnetic base perpendicular to the inner wall of the vertical tank, and the position where the magnetic base is located is the position point of the ultrasonic emission source.

- Step b: the length of the focal length scale 4 is used as the focal length P, the position where the tip end of the focal length scale 4 is located is determined as the placement point of the central point of the reflector.

In Step 604, according to the placement point of the center point of the reflector 1, the reflector is mounted, and the reflector is moved so that the tip end of the focal length scale is aligned with and enters the center point of the reflector. Using the characteristic that the length of the focal length scale is a fixed focal length P, the tip end of the focal length scale is aligned with and enters the central point of the reflector (that is, the central hole O), so that the precise position positioning of the central point O of the reflector on the coordinate axis $TX_P$ is simply realized.

Therefore, in Step 604, mounting the reflector 1 according to the placement point specifically includes:

Step 1: mounting the reflector 1 on the supporting part according to the placement point;

Step 2: adjusting a pitch angle and a horizontal angle of the reflector, so that the pitch angle θ of the reflector is 0 degrees and the horizontal angle φ is 0 degrees, and then the two mutually perpendicular level meters on the supporting part are horizontal.

For a vertical tank with a diameter greater than 4 meters, for example, 15 meters, in order to ensure that there is no support structure for supporting the floating tank top and blocking the ultrasonic signal propagation between the upward side of the reflector and the top of the liquid level floating tank, it is necessary to increase the distance between the reflector and the side wall of the vertical tank, for example, 1000 mm or more. At this time, the focal length P should be selected to be relatively large, for example, 1000 mm or more. At this time, it is necessary to use a focal length scale of 1000 mm or longer, so that it is difficult to be operated and kept in a horizontal straight line. In this case, a laser ranging calibrator can be used. The magnetic base of the laser ranging calibrator is fixed at the position point of the ultrasonic emission source. The positions of the reflector and the platform are adjusted so that the laser emitted by the laser ranging calibrator is emitted at the O point of the reflector, and the displayed distance is equal to the focal length P. Thereafter, the pitch angle and the horizontal angle of the reflector and the platform are adjusted, so that the pitch angle θ of the reflector is 0 degrees and the horizontal angle φ is 0 degrees, and then the two mutually perpendicular level meters on the supporting part are horizontal.

Step 2 further includes:

Step 21: a plane reflecting plate 6 is horizontally mounted right above the reflector 1; each of the two mutually perpendicular edges of the plane reflecting plate 6 is provided with a liquid level meter for adjusting the plane reflecting plate 6 to be horizontal. In the floating roof tank, the plane reflecting plate 6 can be fixedly mounted on the floating roof directly above the reflector. In a tank without a floating roof, the plane reflecting plate 6 is temporarily mounted on a temporary bracket at the top of the reflector. After the reflector of the steering gear is calibrated by a laser ranging scanner, the plane reflecting plate 6 is dismantled.

Step 22: a magnetic base of a laser ranging calibrator is adsorbed and fixed at the position point of the ultrasonic emission source, and the position of the reflector 1 is adjusted by using a scanning function of the laser ranging calibrator, so that the laser emitted by the laser ranging calibrator is emitted at the central point of the reflector, and the distance displayed by the laser ranging calibrator is equal to the focal length P, so that the pitch angle θ of the reflector is 0 degrees and the horizontal angle φ is 0 degrees, and then the two mutually perpendicular level meters on the supporting part are horizontal.

The specific process of adjusting the position of the reflector using the scanning function of the laser ranging calibrator is as follows:

using the scanning function of the laser ranging calibrator to scan the emitted laser into reticles or other graphics which are reflected by the plane reflecting plate 6 arranged above the platform and adjusted to be horizontal, and judging whether the shape and the mounting of the reflector are very accurate by determining whether the reflected signal is focused on the ultrasonic emission source and forms a small circular bright spot, specifically including:

controlling a graphic signal emitted by the laser ranging calibrator; wherein the graphic signal is reflected by a plane reflecting plate 6 arranged above the reflector 1 and adjusted to horizontal, and is focused on the position near the ultrasonic emission source to form a circular bright spot; the graphic signal is a scanning reticle or other graphics.

adjusting the pitch angle, the horizontal angle, the shape and the mounting position of the reflector according to the shape of the graphic signal focused on the position near the ultrasonic emission source, so that the graphic signal near the ultrasonic emission source becomes a circular graphic as small as possible.

In Step 2, another simple method to adjust the mounting angle of the steering gear to make the pitch angle and the horizontal angle of the reflector equal to 0 degrees is to hang the heavy hammer line on the semicircular groove N at the highest position of the reflector with a hook at one end of the heavy hammer line 5, so that the heavy hammer can hang freely. The pitch angle θ of the reflector in the TXY coordinate plane of the third right-handed three-dimensional rectangular coordinate system OXYZ and the horizontal angle φ in the TXZ coordinate plane of the third right-handed three-dimensional rectangular coordinate system OXYZ are adjusted, so that the heavy hammer line 5 enters the semicircular groove M of the platform. The heavy hammer line 5 is not in contact with the edge of the semicircular groove M. The pitch angle and the horizontal angle of the reflector are adjusted, so that the two mutually perpendicular level meters on the supporting part are horizontal, and the accurate angle positioning of the reflecting surface platform is simply completed.

The third right-handed three-dimensional rectangular coordinate system OXYZ is constructed based on the focal length P and the center point of the reflector. The highest point $(X_N,Y_N,0)$ of the reflector on the OXY coordinate plane of the third right-handed three-dimensional rectangular coordinate system OXYZ is the semicircular groove N; and the coordinate of the semicircular groove M in the third right-handed three-dimensional rectangular coordinate system OXYZ is $(X_N,0,0)$.

In this embodiment, it is also necessary to finely adjust the mounting position of the reflector by using the heavy hammer line 5 and a power-assisted fixer.

One end of the heavy hammer line 5 is fixed with a hook, and the other end of the heavy hammer line 5 is hung with a heavy hammer. The power-assisted fixer is formed in such a manner that two ends are equipped with a neodymium magnet respectively and the two ends are connected by rubber bands.

Specifically, the hook is hung in the semicircular groove N of the reflector. When the heavy hammer line is hung freely and statically, the heavy hammer is embedded in the semicircular groove M of the platform 2 and is not contact with the wall of the semicircular groove M, so as to quickly and accurately determine the accurate angles in three directions when the reflector is mounted.

That is, after mounting the reflector 1 according to the placement point, the method further includes:

hanging a heavy hammer line on the semicircular groove N of the reflector, so that a heavy hammer on the heavy hammer line 5 hangs freely; adjusting the pitch angle of the reflector 1 in the TXY coordinate plane of the third right-handed three-dimensional rectangular coordinate system OXYZ and the horizontal angle in the TXZ coordinate plane of the third right-handed three-dimensional rectangular coordinate system OXYZ, so that the heavy hammer line 5 enters the semicircular groove M and the heavy hammer line 5 is not contact with an edge of the semicircular groove M, thus completing the angle positioning of the reflector.

The third right-handed three-dimensional rectangular coordinate system OXYZ is constructed based on the focal length P and the center point of the reflector, and the highest point ($X_N$,$Y_N$,0) of the reflector on the XOY coordinate plane of the third right-handed three-dimensional rectangular coordinate system OXYZ is the semicircular groove N; and the coordinate of the semicircular groove M in the third right-handed three-dimensional rectangular coordinate system OXYZ is ($X_N$,0,0).

In order to facilitate the mounting, the power-assisted fixer can be used, which consists of two neodymium magnet blocks and a rubber band connecting the two magnets. During mounting, a neodymium magnet of the power-assisted fixer is sucked at point A of the platform 2, and a neodymium magnet at the other end thereof is sucked at the lower part of the focus T inside the tank wall. The steering gear is tensioned and temporarily fixed to the tank wall with the help of the tension of the rubber band, which is convenient for adjustment and position calibration.

After the reflector is mounted and calibrated, the points a, b, c and d of the reflector 1 are fixed on the tank wall by welding, bonding or magnetic attraction. The first supporting rod a, the second supporting rod b and the third supporting rod c are fixed. The focal length scale 4, the heavy hammer line 5, the power-assisted fixer and the plane reflecting plate 6 are dismantled. The plane reflecting plate 6 mounted on the floating roof in the floating roof tank will not be dismantled after mounting the reflector of the steering gear.

Because the tank wall where the probe is mounted is not guaranteed to be exactly perpendicular to the horizontal plane, the focal length scale vertically adsorbed on the side wall is not guaranteed to be exactly horizontal, nor is it guaranteed to be exactly perpendicular to the side wall of the vertical tank. However, as long as the distance between the center point O of the reflector and the ultrasonic emission source T on the inner side wall of the vertical tank is guaranteed to be exactly equal to the focal length P by using the focal length scale 4 or the laser ranging scanner, the level meters vertically mounted on the platform 2 of the steering gear are horizontal, and then the angle of the reflector and the shape of the reflecting surface are finely adjusted by using the laser ranging scanner, so that the laser emitted from the laser ranging scanner can be reflected upwards to the horizontally mounted plane reflecting plate 6 through the reflector 1. The shape of the light spot reflected back to the ultrasonic emission source T through the reflector 1 is a small dot, so that the pitch angle error and the horizontal angle error of the focal length scale do not affect the reflector 1 to accurately reflect and focus the ultrasonic waves from all directions back to the ultrasonic emission source.

When the external measurement liquid level meter works, an ultrasonic probe thereof is mounted on an outer wall of the measured vertical tank, and the ultrasonic probe generates an ultrasonic emission source at an inner wall of the measured vertical tank; a position point of the ultrasonic emission source is also a focus of the reflector; an ultrasonic signal emitted by the ultrasonic emission source is emitted to the reflector, is reflected by the reflector, is emitted in parallel to a preset direction, returns according to the original path after passing through the liquid level of the measured vertical tank, and is received by the external measurement liquid level meter; the external measurement liquid level meter determines, according to the ultrasonic signal emitted by the ultrasonic probe and the ultrasonic signal received by the ultrasonic probe, the liquid level position of the measured vertical tank. Obviously, the reflector provided by the present disclosure can meet the requirement that the rays emitted from the focus to any direction in front are emitted parallel to the preset direction after being reflected by the reflector without calculating the positions of boundary points of reflecting surfaces at all levels step by step, thus achieving the purpose of reducing the calculation workload and improving the working efficiency.

Embodiment 5

Figure 6:
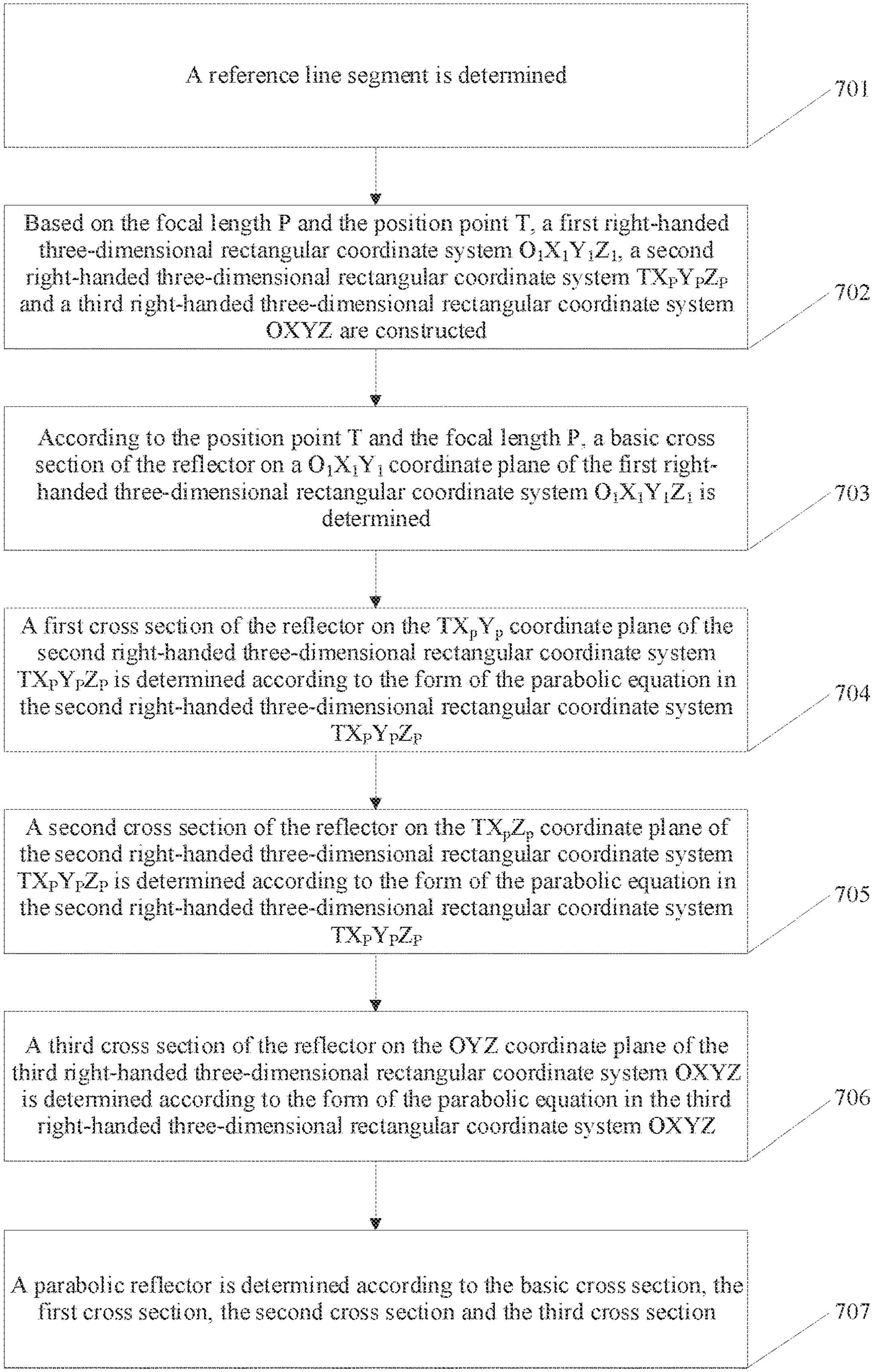
FIG. 6 is a schematic flow chart of a reflector determining method according to the present disclosure.

Referring to FIG. 6, a determining method provided by this embodiment is used for determining the reflector described in Embodiment 1, which is used for reflecting an ultrasonic signal emitted by an ultrasonic emission source, wherein the determining method includes the following steps.

Step 701: a reference line segment is determined; wherein an end point of the reference line segment is a position point T, a length of the reference line segment is equal to a focal length P of the reflector; and the position point T is the position of the ultrasonic emission source.

The focal length P is artificially selected according to the diameter D of the measured vertical tank, and the principle of selection is that the focal length P is less than or equal to D/2.

For example, the horizontal cross section in the vertical tank where the reference line segment is located is the standard plane of the measured vertical tank; and the focal length P is less than or equal to the radius of the standard plane.

For another example, when the method is used to measure the depth of the oil level in an oil well from the wellhead, D=200 mm, and the focal length P=d/2=100 mm is selected.

For another example, when measuring the depth from the water surface of a deep well to the wellhead, when the diameter of the well is D=400 mm, the focal length P=D/2=200 mm is selected.

In addition, when the diameter D of the measured target vertical tank is very large, such as a vertical liquid storage tank, and the diameter D is between 500 mm and 50 m, the principle of determining the focal length P is that there are no structures, such as pipes and beams, that blocks the ultrasonic signal propagation between the upward side of the reflecting surface and the liquid level or the floating roof floating on the liquid level, and ultrasonic waves are not allowed to be emitted on the circular sealing hose at the edge of the floating roof disc. The structural parts in the vertical tank with a large diameter are relatively large. The focal length P of the paraboloid of the selected reflector should be larger if the reflecting surface needs to be farther away from the side wall. For the vertical tank with a diameter of more than 4 meters, the focal length P can be about 1000 mm. When the reflector is larger than the manhole with a diameter of 600 mm in the vertical tank, it is necessary to split the reflector into several parts, which are then sent into the vertical tank through the manhole and then are assembled into a reflector accurately.

Step 702: based on the focal length P and the position point T, a first right-handed three-dimensional rectangular coordinate system $O_1X_1Y_1Z_1$, a second right-handed three-dimensional rectangular coordinate system $TX_PY_PZ_P$ and a third right-handed three-dimensional rectangular coordinate system OXYZ are constructed, as shown in FIG. 1.

The position point T is at a positive value of an $O_1Y_1$ coordinate axis of the first right-handed three-dimensional rectangular coordinate system $O_1X_1Y_1Z_1$, and a length of a line segment $O_1T$ (one endpoint is the origin of the first right-handed three-dimensional rectangular coordinate system $O_1X_1Y_1Z_1$, and the other endpoint is the position point T) is equal to half of the focal length P; the position point T is a coordinate origin of the second right-handed three-dimensional rectangular coordinate system $TX_PY_PZ_P$, the second right-handed three-dimensional rectangular coordinate system $TX_PY_PZ_P$ is obtained by translating the length of the line segment $O_1T$ in a direction of the positive value of the $O_1Y_1$ coordinate axis of the first right-handed three-dimensional rectangular coordinate system $O_1X_1Y_1Z_1$; the $TY_P$ coordinate axis of the second right-handed three-dimensional rectangular coordinate system $TX_PY_PZ_P$ coincides with the $O_1Y_1$ coordinate axis of the first right-handed three-dimensional rectangular coordinate system $O_1X_1Y_1Z_1$, the coordinate axis $TX_p$ of the second right-handed three-dimensional rectangular coordinate system $TX_PY_PZ_P$ is parallel to the coordinate axis $O_1X_1$ of the first right-handed three-dimensional rectangular coordinate system $O_1X_1Y_1Z_1$, and the $TZ_P$ coordinate axis of the second right-handed three-dimensional rectangular coordinate system $TX_PY_PZ_P$ coincides with the $O_1Z_1$ coordinate axis of the first right-handed three-dimensional rectangular coordinate system $O_1X_1Y_1Z_1$.

The coordinate origin O of the third right-handed three-dimensional rectangular coordinate system OXYZ is at a positive value of the coordinate axis $TX_p$ of the second right-handed three-dimensional rectangular coordinate system $TX_PY_PZ_P$, and the coordinate origin O of the third right-handed three-dimensional rectangular coordinate system OXYZ is the other end point of the reference line segment; the length of the line segment TO is equal to the focal length P, the third right-handed three-dimensional rectangular coordinate system OXYZ is obtained by translating the length of the line segment TO in the direction of the positive value of the coordinate axis $TX_p$ of the second right-handed three-dimensional rectangular coordinate system $TX_PY_PZ_P$; and the position point T is located at a negative value of the OX axis of the third right-handed three-dimensional rectangular coordinate system OXYZ; the OX coordinate axis of the third right-handed three-dimensional rectangular coordinate system OXYZ coincides with the coordinate axis $TX_p$ of the second right-handed three-dimensional rectangular coordinate system $TX_PY_PZ_P$; the OY coordinate axis of the third right-handed three-dimensional rectangular coordinate system OXYZ is parallel to the $TY_P$ coordinate axis of the second right-handed three-dimensional rectangular coordinate system $TX_PY_PZ_P$, and the OZ coordinate axis of the third right-handed three-dimensional rectangular coordinate system oxy is parallel to the $TZ_P$ coordinate axis of the second right-handed three-dimensional rectangular coordinate system $TX_PY_PZ_P$.

Step 703: according to the position point T and the focal length P, a basic cross section of the reflector on a $O_1X_1Y_1$ coordinate plane of the first right-handed three-dimensional rectangular coordinate system $O_1X_1Y_1Z_1$ is determined; wherein the basic cross section is a basic parabola, the focal length of the basic parabola is the focal length P; the focus of the basic parabola is the position point T; and the basic parabola rotates with the $O_1Y_1$ coordinate axis as the rotation axis to form a paraboloid.

Figure 7A:
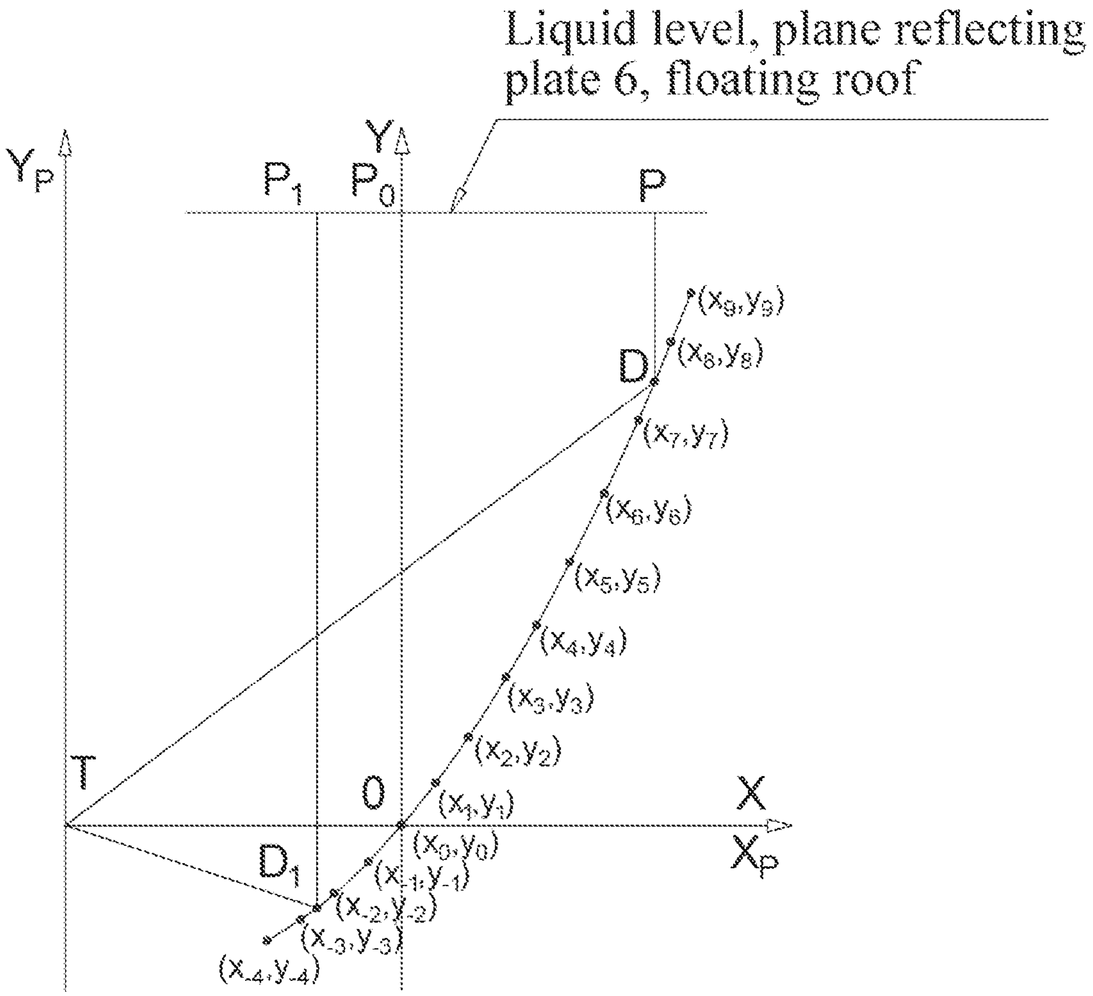
FIG. 7A is a schematic diagram of a first cross section according to the present disclosure.

Step 704: a first cross section of the reflector on the $TX_pY_p$ coordinate plane of the second right-handed three-dimensional rectangular coordinate system $TX_PY_PZ_P$ is determined according to the form of the parabolic equation in the second right-handed three-dimensional rectangular coordinate system $TX_PY_PZ_P$; wherein referring to FIG. 7A, the first cross section is a first parabola; the focal length of the first parabola is the focal length P; and the focus of the first parabola is the position point T.

Figure 7B:
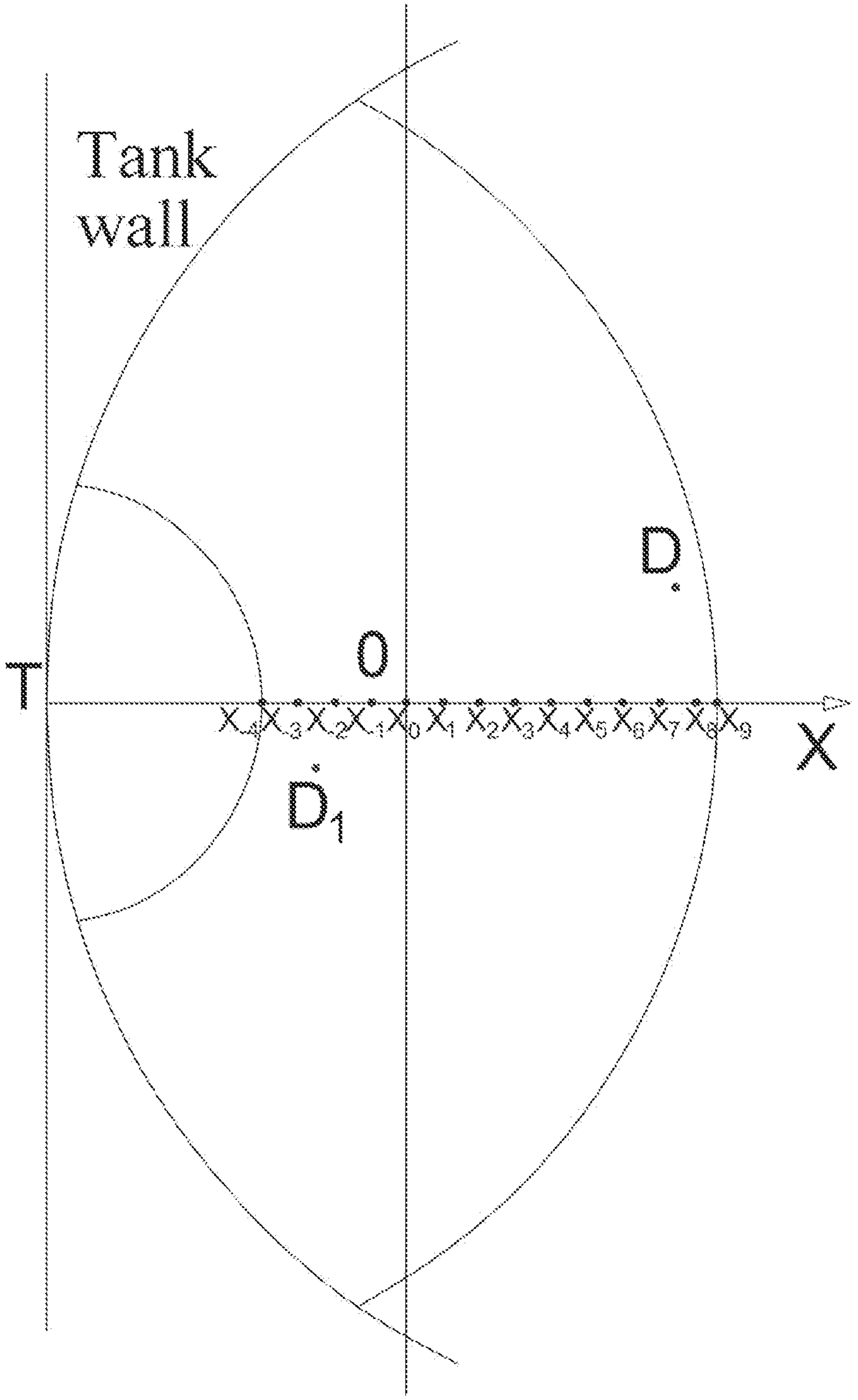
FIG. 7B is a schematic diagram of a second cross section according to the present disclosure.

Step 705: a second cross section of the reflector on the $TX_pZ_p$ coordinate plane of the second right-handed three-dimensional rectangular coordinate system $TX_PY_PZ_P$ is determined according to the form of the parabolic equation in the second right-handed three-dimensional rectangular coordinate system $TX_PY_PZ_P$; wherein referring to FIG. 7B, the second cross section is an arc; a center of the arc is the position point T; and a radius of the arc is the focal length P.

Step 706: a third cross section of the reflector on the OYZ coordinate plane of the third right-handed three-dimensional rectangular coordinate system OXYZ is determined according to the form of the parabolic equation in the third right-handed three-dimensional rectangular coordinate system OXYZ; wherein the third cross section is a second parabola.

Figure 8:
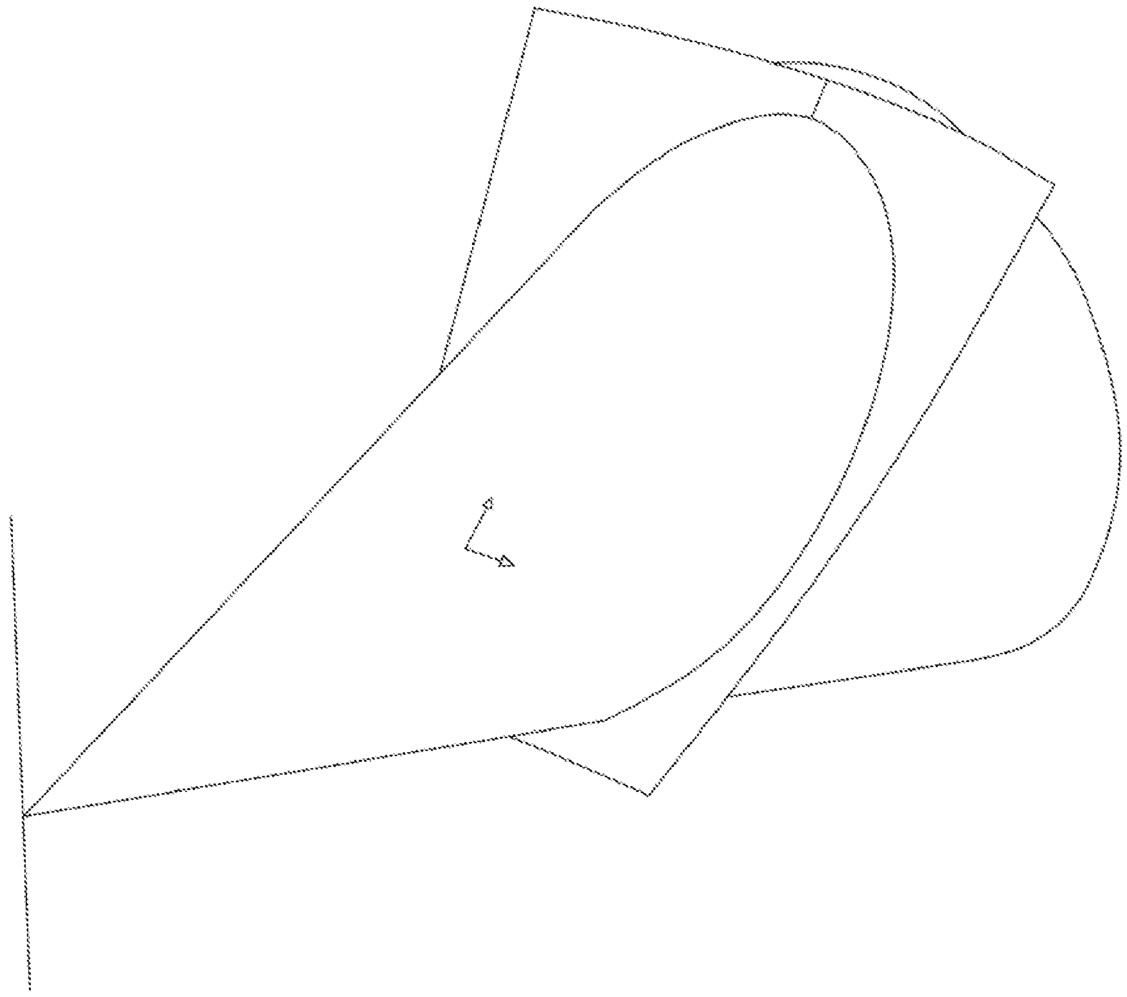
FIG. 8 is a cross-sectional view of a circular reflector according to the present disclosure.

The edge shape of the reflector surface can be arbitrarily selected according to the specific situation, and it is not unique. For example, in order to send the reflector into the vertical tank through a manhole (that is, a circular hole with a sealed cover and a diameter of less than 600 mm reserved on the side wall of the vertical tank for construction workers to enter the interior of the vertical tank) for mounting, the reflector needs to be made into a strip with a width less than 600 mm. For another example, in order to reduce the cost of the mold for processing the reflecting surface, the reflecting surface can be processed into an ellipse to reduce the mold area. As shown in FIG. 8, the projection of the reflecting surface from the ultrasonic emission source T along the $TX_P$ coordinate axis to the O point direction is a circle in the left view, and the top view in the direction downward from the OY coordinate axis is also a circle.

Step 707: a parabolic reflector is determined according to the basic cross section, the first cross section, the second cross section and the third cross section; wherein the center point of the parabolic reflector is the coordinate origin O, the focus of the parabolic reflector is the position point T, and the focal length of the parabolic reflector is the focal length P.

Taking FIG. 7B as an example, the projections in the $TY_P$ axis direction are the projections of the upper and lower edges of the rectangular reflector in the $TX_P$ axis direction, which are all arcs. Among any ray TD emitted from the focus T with an emission angle of θ>0 degrees, an ray DP reflected by the reflector, a point P emitted vertically to the horizontal liquid level, any ray TO with an emission angle of θ=0 degrees, an ray $OP_0$ reflected by the reflector, a point $P_0$ emitted vertically upward to the horizontal liquid level, any ray $TD_1$ with an emission angle of θ<0 degrees, an ray $D_1P_1$ reflected by the reflector, and a point $P_1$ emitted vertically upward to the horizontal liquid level, the reflected rays PD, $P_0O$, $P_1D_1$ reflected by the liquid level are all emitted vertically downward to the reflector, and the rays DT, OT, $D_1T$ reflected by the reflector are all emitted to the focus T. Therefore, the characteristic of the reflector is that the rays emitted from the focus T in any direction forward are reflected by the reflector and emitted in the direction parallel to the $TY_P$ axis.

In this embodiment, the reflector designed by using the parabolic function method can achieve the purpose of reflecting all the rays emitted from the focus in any direction in front to the parallel direction, which significantly reduces the design and calculation workload and improves the efficiency.

In one example, the parabolic equation of the basic cross section on the $O_1X_1Y_1$ coordinate plane of the first coordinate system $O_1X_1Y_1Z_1$ is $x_1^2=2Py_1$, wherein $x_1$ is the $X_1$ coordinate of the coordinate plane $O_1X_1Y_1$, and $y_1$ is the $Y_1$ coordinate of the coordinate plane $O_1X_1Y_1$. The parabola of the basic cross section rotates with the $O_1Y_1$ coordinate axis as the rotation axis to form a paraboloid; and the angle range in which the paraboloid rotates along the $O_1Y_1$ coordinate axis is the horizontal angle range.

The parabolic equation of the first right-handed three-dimensional rectangular coordinate system $O_1X_1Y_1Z_1$ is $x_1^2+z_1^2=2Py_1$; wherein $x_1$ is the coordinate on the coordinate axis $O_1X_1$ of the first right-handed three-dimensional rectangular coordinate system $O_1X_1Y_1Z_1$, $y_1$ is the coordinate on the $O_1Y_1$ coordinate axis of the first right-handed three-dimensional rectangular coordinate system $O_1X_1Y_1Z_1$, and $z_1$ is the coordinate on the $O_1Z_1$ coordinate axis of the first right-handed three-dimensional rectangular coordinate system $O_1X_1Y_1Z_1$; and the paraboloid passes through the coordinate origin (0, 0, 0) of the first right-handed three-dimensional rectangular coordinate system $O_1X_1Y_1Z_1$.

According to the relationship between the first right-handed three-dimensional rectangular coordinate system $O_1X_1Y_1Z_1$ and the second right-handed three-dimensional rectangular coordinate system $TX_PY_PZ_P$, $x_1=x_p$, $y_1=y_p+P/2$ and $z_1=z_p$. The paraboloid equation of the first right-handed three-dimensional rectangular coordinate system is in the form of $x_p^2+z_p^2=2P(y_p+P/2)$ in the second right-handed three-dimensional rectangular coordinate system $TX_PY_PZ_P$.

The paraboloid passes through point (P,0,0), point (−P,0, 0), point (0, −P/2,0), point (0,0, P) and point (0,0,−P) of the second right-handed three-dimensional rectangular coordinate system $TX_PY_PZ_P$. The parabolic equation of the cross section of the reflector parabola on the TXPYP coordinate plane of the second right-handed rectangular coordinate system $TX_PY_PZ_P$ is $x_p^2=2P(y_p+P/2)$.

According to the relationship between the second right-handed three-dimensional rectangular coordinate system $TX_PY_PZ_P$ and the third right-handed three-dimensional rectangular coordinate system OXYZ, $x_p=x+P$, $y_p=y$, $z_p=z$. The paraboloid equation of the second right-handed three-dimensional rectangular coordinate system $TX_PY_PZ_P$ is in the form of $(x+P)^2+z^2=2P(y+P/2)$ in the third right-handed three-dimensional rectangular coordinate system OXYZ. The paraboloid passes through the origin (0, 0, 0) of the third right-handed three-dimensional rectangular coordinate system.

The parabolic equation of the first cross section of the reflector paraboloid on the OXY coordinate plane of the third right-handed rectangular coordinate system OXYZ is $(x+P)^2=2P(y+P/2)$, from which the first parabola function is $y=(x+P)^2/(2P)-P/2$. Based on this, a parabola of the first cross section of the reflector on the coordinate plane OXY of the third right-handed rectangular coordinate system OXYZ can be drawn, as shown in FIG. 7A. The data table of the parabola of the first cross section can be calculated from the first parabola function, as shown in Table 1.

According to the parabolic equation in the third right-handed rectangular coordinate system OXYZ, when y=0, the equation $(x+P)^2+z^2=P^2$ of the reflector on the second cross section of the coordinate plane OXZ is obtained. This is an arc with T as the center and P as the radius. The upper and lower edges of the reflector are concentric arcs with T as the center.

According to the parabolic equation of the reflector in the third right-handed rectangular coordinate system OXYZ, it can be concluded that the parabolic function in the third right-handed rectangular coordinate system is $y=((x+P)^2+z^2)/(2P)-P/2$.

The paraboloid passes through the origin (0, 0, 0) of the third right-handed rectangular coordinate system. According to the paraboloid function in the third right-handed rectangular coordinate system, y value corresponding to each group of (x,z) values is calculated. A paraboloid data table is listed. A paraboloid reflector processing die is processed according to the data table to manufacture the paraboloid reflector.

The range of the pitch angle is the range of the radiation angle θ of the ultrasonic signal emitted by the ultrasonic emission source from the position point T in the $TX_p$ direction on the $TX_pY_p$ coordinate plane, and the pitch angle $\theta=\mathrm{art}(y_p/x_p)$, as shown in FIG. 7A and Table 1. The range of the horizontal angle is the range of the radiation angle φ of the ultrasonic signal emitted by the ultrasonic emission source in the $TX_P$ coordinate direction from the position point T on the $TX_PZ_P$ coordinate plane, and the horizontal angle $\varphi=\mathrm{art}(z_p/x_p)$, as shown in FIG. 7B.

Based on this, taking the focal length P=150 mm as an example, the data table of the first parabola of the paraboloid reflecting surface in Table 1 can be calculated in unit of mm.

$$x_1^2 = 2Py_1;$$

$$x_P^2 = 2P(y_P + P/2),\ x_1 = x_P,\ y_1 = y_P + P/2;$$

$$(x + P)2 = 2P(y + P/2),\ x_P = x + P,\ y_P = y;$$

TABLE 1

Table of First Parabolic Coordinate Values of the Parabolic Reflector (unit: mm)

| | | | |
|---|---|---|---|
| focal length | P | 150 | mm |
| step | δ | 20 | mm |
| Range of the pitch angle | θ | −82 | degree |
| | | 61 | degree |
| | π | 3.14159 | radian |

| $x_1$ | $y_1$ $y_1 = x_1^2/(2P)$ | $x_P$ $x_P = x_1$ | $y_P$ $y_P = y_1 - P/2$ | x $x = x_P - P$ | y $y = y_P$ | pitch angle (degree) $\theta = \mathrm{arctg}(y_P/x_P)$ |
|---|---|---|---|---|---|---|
| 10 | 0.33 | 10 | −74.67 | −140 | −74.67 | −82.4 |
| 30 | 3.00 | 30 | −72.00 | −120 | −72.00 | −67.4 |
| 50 | 8.33 | 50 | −66.67 | −100 | −66.67 | −53.1 |
| 70 | 16.33 | 70 | −58.67 | −80 | −58.67 | −40.0 |
| 90 | 27.00 | 90 | −48.00 | −60 | −48.00 | −28.1 |
| 110 | 40.33 | 110 | −34.67 | −40 | −34.67 | −17.5 |
| 130 | 56.33 | 130 | −18.67 | −20 | −18.67 | −8.2 |
| 150 | 75.00 | 150 | 0.00 | 0 | 0.00 | 0.0 |
| 170 | 96.33 | 170 | 21.33 | 20 | 21.33 | 7.2 |
| 190 | 120.33 | 190 | 45.33 | 40 | 45.33 | 13.4 |
| 210 | 147.00 | 210 | 72.00 | 60 | 72.00 | 18.9 |

TABLE 1-continued

Table of First Parabolic Coordinate Values of the Parabolic Reflector (unit: mm)

| | | | | | | |
|---|---|---|---|---|---|---|
| 230 | 176.33 | 230 | 101.33 | 80 | 101.33 | 23.8 |
| 250 | 208.33 | 250 | 133.33 | 100 | 133.33 | 28.1 |
| 270 | 243.00 | 270 | 168.00 | 120 | 168.00 | 31.9 |
| 290 | 280.33 | 290 | 205.33 | 140 | 205.33 | 35.3 |
| 310 | 320.33 | 310 | 245.33 | 160 | 245.33 | 38.4 |
| 330 | 363.00 | 330 | 288.00 | 180 | 288.00 | 41.1 |
| 350 | 408.33 | 350 | 333.33 | 200 | 333.33 | 43.6 |
| 370 | 456.33 | 370 | 381.33 | 220 | 381.33 | 45.9 |
| 390 | 507.00 | 390 | 432.00 | 240 | 432.00 | 47.9 |
| 410 | 560.33 | 410 | 485.33 | 260 | 485.33 | 49.8 |
| 430 | 616.33 | 430 | 541.33 | 280 | 541.33 | 51.5 |
| 450 | 675.00 | 450 | 600.00 | 300 | 600.00 | 53.1 |
| 470 | 736.33 | 470 | 661.33 | 320 | 661.33 | 54.6 |
| 490 | 800.33 | 490 | 725.33 | 340 | 725.33 | 56.0 |
| 510 | 867.00 | 510 | 792.00 | 360 | 792.00 | 57.2 |
| 530 | 936.33 | 530 | 861.33 | 380 | 861.33 | 58.4 |
| 550 | 1008.33 | 550 | 933.33 | 400 | 933.33 | 59.5 |
| 570 | 1083.00 | 570 | 1008.00 | 420 | 1008.00 | 60.5 |

The range of the pitch angle and the range of the horizontal angle are both determined according to actual conditions and work requirements; there is no structure between the parabolic reflector and the liquid level of a measured vertical tank to block the ultrasonic signal propagation; and the focal length P is less than or equal to the radius of the measured vertical tank.

Preferably, the range of the pitch angle and the range of the horizontal angle are both determined according to actual conditions and work requirements; there is no structure between the parabolic reflector and the liquid level of a measured vertical tank to block the ultrasonic signal propagation; and the focal length P is less than or equal to the radius of the measured vertical tank.

The range of the pitch angle θ in this embodiment is about −82°~61°; the range of the horizontal angle is about −80°~80°. The larger the range of the pitch angle θ and the horizontal angle φ, the more ultrasonic signals emitted by the ultrasonic emission source covered by the reflector, the stronger the reflected wave of the liquid level received by the ultrasonic probe, the more accurate the liquid level measured by the external measurement liquid level meter, the greater the liquid viscosity that can be measured, and the wider the application range.

When the pitch angle θ is close to 90°, the height value of the reflector is close to ∞, which cannot be realized. When the maximum value is 61°, enough ultrasonic signals emitted upward are covered. The negative value of the pitch angle θ has a maximum value of −82°, enough ultrasonic signals emitted downward are covered. When the horizontal angle φ has a value of −80° or 80°, the reflector approaches the tank wall in the horizontal direction, and the reflector can be fixed on the tank wall through the connector.

Further, the method provided by this embodiment further includes: if the tank wall at the probe mounted in the measured vertical tank is in an inclined state, adjusting and selecting an appropriate part of the paraboloid as the reflecting surface of the paraboloid reflector, and finally determining the reflector required for measuring the measured vertical tank, specifically including:

when the measured vertical tank is in an inclined state, reserving the area where the parabolic reflector is capable of receiving ultrasonic waves, and determining the area where the ultrasonic waves are received as a reflector required for measuring the measured vertical tank.

For example, in the third right-handed three-dimensional rectangular coordinate system OXYZ, when the upper part of the surface where the probe is mounted on the outer wall of the measured vertical tank inclines to the outside of the vertical tank, the direction of rays emitted by the ultrasonic emission source is upward, and the upper area of the parabolic reflector is determined as the reflector required by the measured vertical tank;

when the upper part of the surface where the probe is mounted on the outer wall of the measured vertical tank inclines to the inside of the vertical tank, the direction of rays emitted by the ultrasonic emission source is downward, and the lower area of the parabolic reflector is determined as the reflector required by the measured vertical tank;

when the left side of the surface where the probe is mounted on the outer wall of the measured vertical tank inclines to the outside of the vertical tank, the direction of rays emitted by the ultrasonic emission source is leftward, and the left area of the determined parabolic reflector is determined as the reflector required by the measured vertical tank; wherein the left region is located at the negative value of the OZ axis;

when the left side of the surface where the probe is mounted on the outer wall of the measured vertical tank inclines to the inside of the vertical tank, the direction of the rays emitted by the ultrasonic emission source is rightward, and the right area of the determined parabolic reflector is determined as the reflector required by the measured vertical tank; wherein the right area is located at the positive value of the OZ axis.

Embodiment 5

Figure 9:
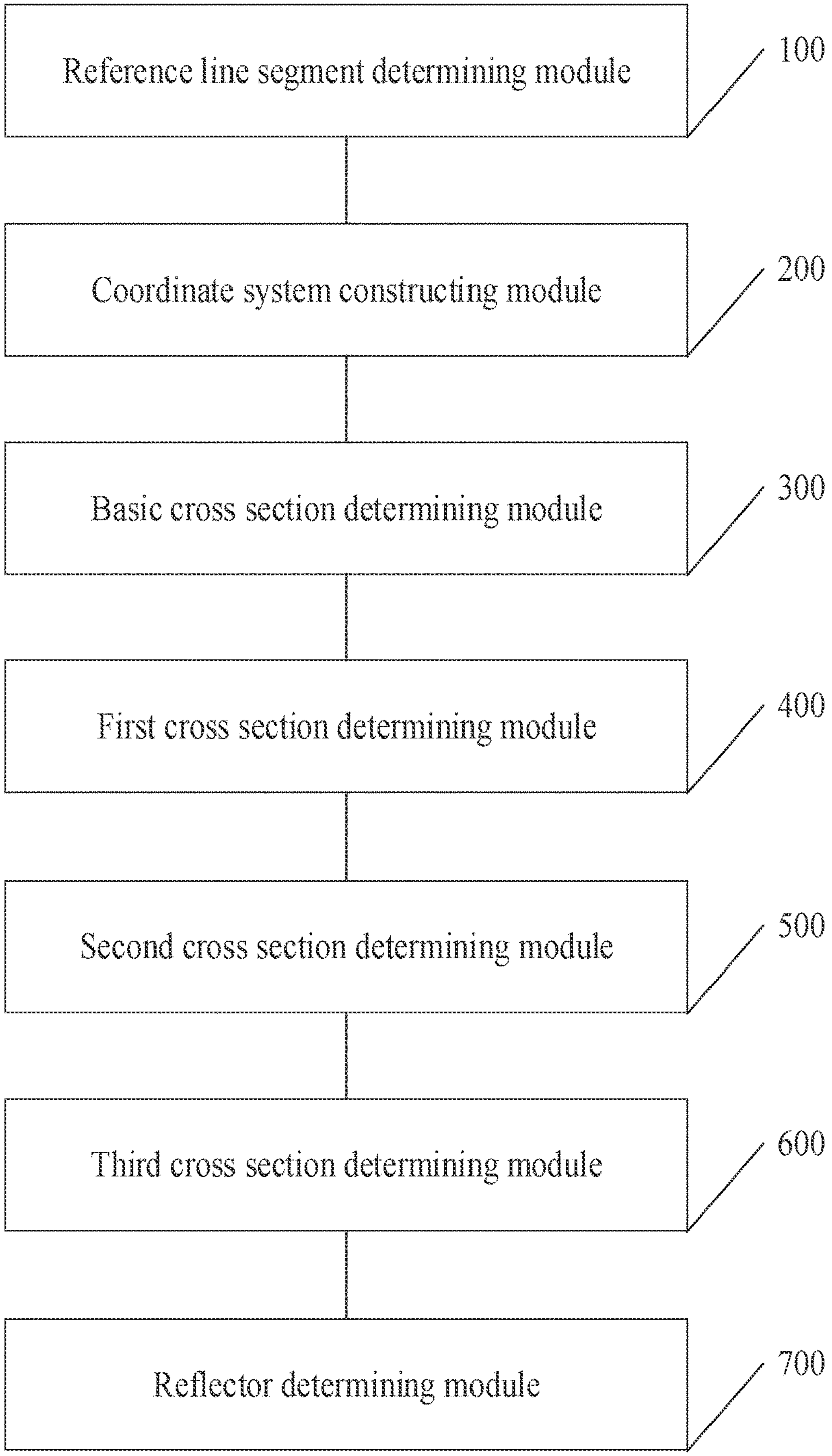
FIG. 9 is a schematic structural diagram of a reflector determining system according to the present disclosure.

Referring to FIG. 9, this embodiment provides a determining system for determining a reflector for reflecting an ultrasonic signal emitted by an ultrasonic emission source, wherein the determining system includes:

a reference line segment determining module 100, which is configured to determine a reference line segment; wherein an end point of the reference line segment is a position point T, a length of the reference line segment is equal to a focal length P of the reflector; and the position point T is the position of the ultrasonic emission source;

a coordinate system constructing module 200, which is configured to, based on the focal length P and the position point T, construct a first right-handed three-dimensional rectangular coordinate system $O_1X_1Y_1Z_1$, a second right-handed three-dimensional rectangular coordinate system $TX_PY_PZ_P$ and a third right-handed three-dimensional rectangular coordinate system OXYZ; wherein the position point T is at a positive value of an $O_1Y_1$ coordinate axis of the first right-handed three-dimensional rectangular coordinate system $O_1X_1Y_1Z_1$, and a length of a line segment $O_1T$ is equal to half of the focal length P; the position point T is a coordinate origin of the second right-handed three-dimensional rectangular coordinate system $TX_PY_PZ_P$, the second right-handed three-dimensional rectangular coordinate system $TX_PY_PZ_P$ is obtained by translating the length of the line segment $O_1T$ in a direction of the positive value of the $O_1Y_1$ coordinate axis of the first right-handed three-dimensional rectangular coordinate system $O_1X_1Y_1Z_1$; a coordinate origin O of the third right-handed three-dimensional rectangular coordinate system OXYZ is at a positive value of the coordinate axis $TX_p$ of the second right-handed three-dimensional rectangular coordinate system $TX_PY_PZ_P$, and the coordinate origin O of the third right-handed three-dimensional rectangular coordinate system OXYZ is the other end point of the reference line segment; the length of the line segment TO is equal to the focal length P, the third right-handed three-dimensional rectangular coordinate system OXYZ is obtained by translating the length of the line segment TO in the direction of the positive value of the coordinate axis $TX_p$ of the second right-handed three-dimensional rectangular coordinate system $TX_PY_PZ_P$; and the position point T is located at a negative value of the OX axis of the third right-handed three-dimensional rectangular coordinate system OXYZ.

a basic cross section determining module 300, which is configured to, according to the position point T and the focal length P, determine a basic cross section of the reflector on a $O_1X_1Y_1$ coordinate plane of the first right-handed three-dimensional rectangular coordinate system $O_1X_1Y_1Z_1$; wherein the basic cross section is a basic parabola, the focal length of the basic parabola is the focal length P; the focus of the basic parabola is the position point T; and the basic parabola rotates with the $O_1Y_1$ coordinate axis as the rotation axis to form a paraboloid;

a first cross section determining module 400, which is configured to determine a first cross section of the reflector on the $TX_pY_p$ coordinate plane of the second right-handed three-dimensional rectangular coordinate system $TX_PY_PZ_P$ according to the form of the parabolic equation in the second right-handed three-dimensional rectangular coordinate system $TX_PY_PZ_P$; wherein the first cross section is a first parabola; the focal length of the first parabola is the focal length P; and the focus of the first parabola is the position point T;

a second cross section determining module 500, which is configured to determine a second cross section of the reflector on the $TX_pZ_p$ coordinate plane of the second right-handed three-dimensional rectangular coordinate system $TX_PY_PZ_P$ according to the form of the parabolic equation in the second right-handed three-dimensional rectangular coordinate system $TX_PY_PZ_P$; wherein the second cross section is an arc; a radius of the arc is the focal length P; and a center of the arc is the position point T;

a third cross section determining module 600, which is configured to determine a third cross section of the reflector on the OYZ coordinate plane of the third right-handed three-dimensional rectangular coordinate system OXYZ according to the form of the parabolic equation in the third right-handed three-dimensional rectangular coordinate system OXYZ; wherein the third cross section is a second parabola, the focal length of the second parabola is the focal length P; and the focus of the second parabola is the position point T;

a reflector determining module 700, which is configured to determine a parabolic reflector according to the basic cross section, the first cross section, the second cross section and the third cross section; wherein the center point of the parabolic reflector is the coordinate origin O, the focus of the parabolic reflector is the position point T, and the focal length of the parabolic reflector is the focal length P.

For the problem of measuring the liquid level of the vertical tank by using a parabolic focusing steering gear with an external measurement liquid level meter, because the measured liquid level is horizontal, the specified direction A that requires the ultrasonic wave to be emitted after being reflected by the steering gear is vertically upward toward the horizontal liquid level. Therefore, the reference line segment is a horizontal straight line segment perpendicular to the specified direction A. Therefore, the coordinate axis $O_1X_1$ of the established first right-handed rectangular coordinate system $O_1X_1Y_1Z_1$ is parallel to the reference line segment, and the direction of the coordinate axis $O_1X_1$ is rightward.

The specified direction A that requires the ultrasonic wave to be reflected by the steering gear is any direction, and the reference line segment is a straight line segment perpendicular to the specified direction A. The coordinate axis $O_1X_1$ of the first right-handed rectangular coordinate system $O_1X_1Y_1Z_1$ is parallel to the reference line segment, and the direction of the coordinate axis $O_1X_1$ is the same as the ultrasonic emission direction.

The parabolic equation of the reflector expressed by the three-dimensional right-handed rectangular coordinate system used in the present disclosure can also be transformed into a form of a three-dimensional right-handed polar coordinate system through ordinary coordinate transformation.

According to the present disclosure, the reflector is calculated and determined by using the paraboloid function under the narrowed application range that the reflection directions are parallel, so that the reflecting surface data with any precision requirement can be easily calculated, the man-hour of drawing to verify the correctness of the calculated number is saved, the design and calculation workload is reduced, the design time is shortened, the production efficiency is improved, the purpose of measuring the liquid level of the vertical tank from the side wall by using an external measurement liquid level meter is effectively realized, and the method is more practical and easier to be widely applied.

In this specification, various embodiments are described in a progressive way. The differences between each embodiment and other embodiments are highlighted, and the same and similar parts of various embodiments can be referred to each other. In this specification, specific examples are used to explain the principle and implementation of the present disclosure. The description of the above embodiments is only used to help understand the method of the present disclosure and its core idea. At the same time, according to the idea of the present disclosure, there will be changes in the specific implementation and application scope for those skilled in the art. In summary, the contents of this specification should not be construed as limiting the present disclosure.

What is claimed is:

1. A vertical tank external measurement liquid level meter, comprising an external measurement liquid level meter, an ultrasonic signal source locator, and a reflector;

wherein the reflector is determined by performing operations comprising:

determining a reference line segment; wherein an end point of the reference line segment is a position point T of an ultrasonic emission source, a length of the reference line segment is equal to a focal length P of the reflector;

based on the focal length P and the position point T, constructing a first right-handed three-dimensional rectangular coordinate system $O_1X_1Y_1Z_1$, a second right-handed three-dimensional rectangular coordinate system $TX_PY_PZ_P$ and a third right-handed three-dimensional rectangular coordinate system OXYZ; wherein the position point Tis at a positive value of an $O_1Y_1$ coordinate axis of the first right-handed three-dimensional rectangular coordinate system $O_1X_1Y_1Z_1$, and a length of a line segment $O_1T$ is equal to half of the focal length P; the position point T is a coordinate origin of the second right-handed three-dimensional rectangular coordinate system $TX_PY_PZ_P$, the second right-handed three-dimensional rectangular coordinate system $TX_PY_PZ_P$ is obtained by translating the length of the line segment $O_1T$ in a direction of the positive value of the $O_1Y_1$ coordinate axis of the first right-handed three-dimensional rectangular coordinate system $O_1X_1Y_1Z_1$; a coordinate origin O of the third right-handed three-dimensional rectangular coordinate system OXYZ is at a positive value of the coordinate axis $TX_p$ of the second right-handed three-dimensional rectangular coordinate system $TX_PY_PZ_P$, and the coordinate origin O of the third right-handed three-dimensional rectangular coordinate system OXYZ is the other end point of the reference line segment; the length of the line segment TO is equal to the focal length P, the third right-handed three-dimensional rectangular coordinate system OXYZ is obtained by translating the length of the line segment TO in the direction of the positive value of the coordinate axis $TX_p$ of the second right-handed three-dimensional rectangular coordinate system $TX_PY_PZ_P$; and the position point T is located at a negative value of the OX axis of the third right-handed three-dimensional rectangular coordinate system OXYZ;

according to the position point T and the focal length P, determining a basic cross section of the reflector on a $O_1X_1Y_1$ coordinate plane of the first right-handed three-dimensional rectangular coordinate system $O_1X_1Y_1Z_1$; wherein the basic cross section is a basic parabola, the focal length of the basic parabola is the focal length P; the focus of the basic parabola is the position point T; and the basic parabola rotates with the $O_1Y_1$ coordinate axis as the rotation axis to form a paraboloid;

determining a first cross section of the reflector on the $TX_pY_p$ coordinate plane of the second right-handed three-dimensional rectangular coordinate system $TX_PY_PZ_P$ according to the form of the parabolic equation in the second right-handed three-dimensional rectangular coordinate system $TX_PY_PZ_P$; wherein the first cross section is a first parabola; the focal length of the first parabola is the focal length P; and the focus of the first parabola is the position point T;

determining a second cross section of the reflector on the $TX_pZ_p$ coordinate plane of the second right-handed three-dimensional rectangular coordinate system $TX_PY_PZ_P$ according to the form of the parabolic equation in the second right-handed three-dimensional rectangular coordinate system $TX_PY_PZ_P$; wherein the second cross section is an arc; a radius of the arc is the focal length P; and a center of the arc is the position point T;

determining a third cross section of the reflector on the OYZ coordinate plane of the third right-handed three-dimensional rectangular coordinate system OXYZ according to the form of the parabolic equation in the third right-handed three-dimensional rectangular coordinate system OXYZ; wherein the third cross section is a second parabola; the focal length of the second parabola is the focal length P; and the focus of the second parabola is the position point T;

determining a parabolic reflector according to the basic cross section, the first cross section, the second cross section and the third cross section; wherein the center point of the parabolic reflector is the coordinate origin O;

wherein the ultrasonic signal source locator comprises an ultrasonic transmitting probe, an ultrasonic transmitting circuit connected with the ultrasonic transmitting probe, an ultrasonic receiving probe, an ultrasonic receiving circuit connected with the ultrasonic receiving probe and an ultrasonic intensity indicator; wherein the ultrasonic transmitting probe emits ultrasonic waves to a vertical tank wall from the outside of a measured vertical tank, and the ultrasonic receiving probe receives ultrasonic signals from the inside of the vertical tank wall, uses the intensity indication displayed by the ultrasonic intensity indicator to find the position of the received strongest ultrasonic signals, and determines the position point T of the ultrasonic emission source formed on the inside of the vertical tank wall after the ultrasonic waves emitted by the ultrasonic transmitting probe from the outside of the vertical tank wall pass through the vertical tank wall;

the reflector is configured to reflect an ultrasonic signal emitted by the ultrasonic emission source so that the reflected ultrasonic signal is emitted to a liquid level of the measured vertical tank along a preset direction, then reflected and returned back to the position point T of the ultrasonic emission source along the preset direction, and received by a measuring head of the external measurement liquid level meter, and wherein the focus of the reflector is the position point T, and the focal length of the reflector is the focal length P; and the external measurement liquid level meter is configured to measure a liquid level height in the measured vertical tank from the outside of the measured vertical tank based on the received ultrasonic signal from the measuring head and the emitted ultrasonic signal from the ultrasonic emission source.

2. The vertical tank external measurement liquid level meter according to claim 1, further comprising a supporting part; wherein the supporting part is used for mounting the reflector in the measured vertical tank.

3. The vertical tank external measurement liquid level meter according to claim 2, wherein the supporting part comprises a platform; a symmetrical center line of the platform coincides with the OX axis in the third right-handed three-dimensional rectangular coordinate system OXYZ.

4. The vertical tank external measurement liquid level meter according to claim 2, wherein the supporting part further comprises at least three tubular supporting rods with adjustable lengths, namely a first supporting rod, a second supporting rod and a third supporting rod; the first supporting rod, the second supporting rod and the third supporting rod are connected and fixed with each other through a transverse connecting rod;

an upper end of the first supporting rod passes through the vicinity of a semicircular groove M of the supporting part and the vicinity of a semicircular groove N of the reflector in sequence; the second supporting rod and the third supporting rod are located at both sides of the first supporting rod, respectively; an upper end of the second supporting rod and an upper end of the third supporting rod are both fixed on the supporting part;

a highest point ($X_N$, $Y_N$,0) of the reflector on the OXY coordinate plane of the third right-handed three-dimensional rectangular coordinate system OXYZ is the semicircular groove N; the semicircular groove M is on the symmetrical center line of the platform, and the coordinate of the semicircular groove M in the third right-handed three-dimensional rectangular coordinate system OXYZ is ($X_N$,0,0);

a lower end of the first supporting rod, a lower end of the second supporting rod and a lower end of the third supporting rod are all fixed at the bottom of the measured vertical tank during operation.

5. The vertical tank external measurement liquid level meter according to claim 2, wherein the reflector is fixed on the supporting part to form a steering gear; and the steering gear is mounted on the inner wall of the measured vertical tank.

6. A mounting method, wherein the mounting method is used for mounting the vertical tank external measurement liquid level meter according to claim 1, comprising:

determining a selection area; wherein the selection area comprises a space area between an ultrasonic signal source and the reflector and a space area between the reflector and a liquid level directly above the reflector, wherein a measured vertical tank has no structure for blocking the ultrasonic signal propagation in the selection area;

determining a position point of an ultrasonic emission source on an inner wall of the measured vertical tank by using an ultrasonic signal source locator in the selection area;

determining a placement point of a center point of the reflector according to the position point of the ultrasonic emission source and the focal length P;

mounting the reflector according to the placement point, so that the center point of the reflector coincides with the placement point, and the focus of the reflector is the position point of the ultrasonic emission source.

7. The mounting method according to claim 6, wherein the ultrasonic signal source locator comprises an ultrasonic transmitting circuit, an ultrasonic transmitting probe, an ultrasonic receiving circuit, an ultrasonic receiving probe and an ultrasonic intensity indicator connected with the ultrasonic receiving probe;

determining a position point of an ultrasonic emission source on an inner wall of the measured vertical tank by using an ultrasonic signal source locator in the selection area specifically comprises:

mounting the ultrasonic transmitting probe on a target area of an outer wall of the measured vertical tank, wherein the target area is opposite to the selection area;

mounting the ultrasonic receiving probe on the inner wall corresponding to the ultrasonic transmitting probe;

adjusting the positions of the ultrasonic transmitting probe and the ultrasonic receiving probe through the ultrasonic intensity indicator until the position with a strongest signal is determined; wherein the position with the strongest signal is located in the target area; and the position with the strong signal is the position point of the ultrasonic emission source;

marking the position of the ultrasonic transmitting probe outside the selected side wall of the vertical tank and the position point of the ultrasonic emission source inside the side wall of the vertical tank, respectively.

8. The mounting method according to claim 7, wherein a focal length scale is a straight rod with a length equal to the focal length P, one end of the focal length scale is a tip end, and the other end thereof is provided with a magnetic adsorption end, an end face of the magnetic adsorption end is perpendicular to an axial direction of the focal length scale; determining a placement point of a center point of the reflector according to the position point of the ultrasonic emission source and the focal length P specifically comprises:

fixing the magnetic adsorption end of the focal length scale at the position point of the ultrasonic emission source by a magnetic force;

adjusting the position of the reflector, so that the tip end of the focal length scale is inserted into a small hole at the center point O of the reflector, and then the center point of the reflector is positioned at the placement point.

9. The mounting method according to claim 6, wherein mounting the reflector according to the placement point specifically comprises:

mounting the reflector on the supporting part according to the placement point;

adjusting a pitch angle and a horizontal angle of the reflector, so that the pitch angle θ of the reflector is 0 degrees and the horizontal angle φ is 0 degrees, and then the two mutually perpendicular level meters on the supporting part are horizontal.

10. The mounting method according to claim 9, wherein adjusting a pitch angle and a horizontal angle of the reflector, so that the pitch angle θ of the reflector is 0 degrees and the horizontal angle φ is 0 degrees, and then the two mutually perpendicular level meters on the supporting part are horizontal, specifically comprises:

hanging a heavy hammer line on the semicircular groove N of the reflector, so that a heavy hammer on the heavy hammer line hangs freely;

adjusting the pitch angle of the reflector in the TXY coordinate plane of the third right-handed three-dimensional rectangular coordinate system OXYZ and the horizontal angle in the TXZ coordinate plane of the third right-handed three-dimensional rectangular coordinate system OXYZ, so that the heavy hammer line enters the semicircular groove M and is not contact with an edge of the semicircular groove M;

adjusting the pitch angle and the horizontal angle of the reflector so that two mutually perpendicular level meters on the supporting part are horizontal;

wherein the third right-handed three-dimensional rectangular coordinate system OXYZ is constructed based on the focal length P and the center point of the reflector, and the highest point ($X_N$, $Y_N$,0) of the reflector on the OXY coordinate plane of the third right-handed three-dimensional rectangular coordinate system OXYZ is the semicircular groove N; and the coordinate of the semicircular groove M in the third right-handed three-dimensional rectangular coordinate system OXYZ is ($X_N$,0,0).

11. The mounting method according to claim 9, wherein adjusting a pitch angle and a horizontal angle of the reflector, so that the pitch angle θ of the reflector is 0 degrees and the horizontal angle φ is 0 degrees, and then the two mutually perpendicular level meters on the supporting part are horizontal, specifically comprises:

adsorbing and fixing a magnetic base of a laser ranging calibrator at the position point of the ultrasonic emission source, wherein the end face of the magnetic base of the laser ranging calibrator is perpendicular to the direction in which the laser is emitted by the laser ranging calibrator, and adjusting the position and the shape of the reflector by using a scanning function of the laser ranging calibrator, so that the laser emitted by the laser ranging calibrator is emitted at the central point of the reflector, and the distance displayed by the laser ranging calibrator is equal to the focal length P, so that the pitch angle θ of the reflector is 0 degrees and the horizontal angle φ is 0 degrees, and then the two mutually perpendicular level meters on the supporting part are horizontal.

12. The mounting method according to claim 11, wherein adjusting the position and the shape of the reflector by using a scanning function of the laser ranging calibrator specifically comprises:

controlling a graphic signal emitted by the laser ranging calibrator; wherein the graphic signal is reflected by a plane reflecting plate arranged above the reflector and adjusted to horizontal, and is focused on the position near the ultrasonic emission source after being reflected by the reflector to form a circular bright spot;

adjusting the pitch angle, the horizontal angle, the shape and the mounting position of the reflector according to the shape of the graphic signal focused on the position near the ultrasonic emission source, so that the graphic signal near the ultrasonic emission source becomes a circular graphic as small as possible.

13. The vertical tank external measurement liquid level meter according to claim 1, wherein the equation of the basic parabola on the $O_1X_1Y_1$ coordinate plane of the first right-handed three-dimensional rectangular coordinate system $O_1X_1Y_1Z_1$ is $x_1^2=2Py_1$; where $x_1$ is an $X_1$ coordinate of the $O_1X_1Y_1$ coordinate plane, and $y_1$ is the $Y_1$ coordinate of the $O_1X_1Y_1$ coordinate plane;

the parabolic equation is in the form of $x_1^2+Z_1^2=2Py_1$ on the first right-handed three-dimensional rectangular coordinate system $O_1X_1Y_1Z_1$; wherein $x_1$ is the coordinate on the coordinate axis $O_1X_1$ of the first right-handed three-dimensional rectangular coordinate system $O_1X_1Y_1Z_1$, $y_1$ is the coordinate on the $O_1Y_1$ coordinate axis of the first right-handed three-dimensional rectangular coordinate system $O_1X_1Y_1Z_1$, and $z_1$ is the coordinate on the $O_1Z_1$ coordinate axis of the first right-handed three-dimensional rectangular coordinate system $O_1X_1Y_1Z_1$;

the parabolic equation is in the form of $x_p^2+z_p^2=2P(y_p+P/2)$ in the second right-handed three-dimensional rectangular coordinate system $TX_PY_PZ_P$; wherein $x_p$ is the coordinate on the coordinate axis $TX_p$ of the second right-handed three-dimensional rectangular coordinate system $TX_PY_PZ_P$, $y_p$ is the coordinate on the $TY_p$ coordinate axis of the second right-handed three-dimensional rectangular coordinate system $TX_PY_PZ_P$, and $Z_P$ is the coordinate on the $TZ_p$ coordinate axis of the second right-handed three-dimensional rectangular coordinate system $TX_PY_PZ_P$;

the parabolic equation is in the form of $(x+P)^2+z^2=2Py+P^2$ in the third right-handed three-dimensional rectangular coordinate system OXYZ; wherein x is the coordinate on the OX coordinate axis of the third right-handed three-dimensional rectangular coordinate system OXYZ, y is the coordinate on the OY coordinate axis of the third right-handed three-dimensional rectangular coordinate system OXYZ, and z is the coordinate on the OZ coordinate axis of the third right-handed three-dimensional rectangular coordinate system OXYZ.

14. The vertical tank external measurement liquid level meter according to claim 1, wherein the equation of the first parabola is $x_p^2=2Py_p+P^2$;

on the first cross section, a pitch angle of the ultrasonic emission source emitted from the coordinate origin T on the $TX_pY_p$ coordinate plane of the second right-handed three-dimensional rectangular coordinate system $TX_PY_PZ_P$ to any point $(x_p,y_p)$ on the first parabola is θ=art $(y_p/x_p)$; wherein $x_p$ is a $TX_p$ coordinate value of a projection point $(x_p,y_p)$ on the first parabola, $y_p$ is a $TY_p$ coordinate value of the projection point $(x_p,y_p)$ on the first parabola; the range of the pitch angle is the range of a radiation angle of the ultrasonic signal emitted by the ultrasonic emission source on the $TX_pY_p$ coordinate plane;

the equation of the arc is $x_p^2+Z_P^2=P^2$;

a horizontal angle of the ultrasonic emission source from the coordinate origin T of the second right-handed three-dimensional rectangular coordinate system $TX_PY_PZ_P$ to any point $(x_p,Z_P)$ on the arc is θ=art $(Z_P/x_p)$; wherein $x_p$ is a $TX_p$ coordinate value of the projection point $(x_p,Z_P)$ that the ultrasonic signal emitted from the position point T emits on the arc of the $TX_pZ_p$ coordinate plane, $Z_P$ is a $TZ_p$ coordinate value of the projection point $(x_p,Z_P)$ that the ultrasonic signal emitted from the position point T emits on the arc of the $TX_pZ_p$ coordinate plane; the range of the horizontal angle is the range of the radiation angle of the ultrasonic signal emitted by the ultrasonic emission source on the $TX_pZ_p$ coordinate plane;

the equation of the second parabola is $z^2=2Py$, and the second parabola is on the OYZ coordinate plane of the third right-handed three-dimensional rectangular coordinate system OXYZ.

15. The vertical tank external measurement liquid level meter according to claim 1, wherein there is no structure between the parabolic reflector and the liquid level of a measured vertical tank to block the ultrasonic signal propagation; and the focal length P is less than or equal to the radius of the measured vertical tank.

16. The vertical tank external measurement liquid level meter according to claim 1, wherein when the measured vertical tank is in an inclined state, the area where the parabolic reflector is capable of receiving ultrasonic waves is reserved, and the area where the ultrasonic waves are received is determined as a reflector required for measuring the measured vertical tank.

* * * * *